United States Patent [19]

Haines et al.

[11] Patent Number: 4,823,076
[45] Date of Patent: Apr. 18, 1989

[54] METHOD AND APPARATUS FOR TRIGGERING

[75] Inventors: Douglas I. Haines, Mulino; W. Riley Stock; David E. Dobak, both of Beaverton, all of Oreg.

[73] Assignee: Tektronix, Inc., Beaverton, Oreg.

[21] Appl. No.: 840,634

[22] Filed: Mar. 17, 1986

[51] Int. Cl.$^4$ .................. G01R 13/28; G05B 19/02
[52] U.S. Cl. .................. 324/121 R; 340/825.04; 364/487
[58] Field of Search ............ 324/121 R, 73 R; 364/481, 487; 315/392, 367; 340/825.04

[56] References Cited

U.S. PATENT DOCUMENTS

| | | | |
|---|---|---|---|
| 4,100,532 | 7/1978 | Farnbach | 364/481 |
| 4,390,837 | 6/1983 | Hotvedt | 324/73 R |
| 4,585,975 | 4/1986 | Wimmer | 324/121 R |
| 4,697,138 | 9/1987 | Morishita et al. | 324/121 R |

Primary Examiner—Ernest F. Karlsen
Attorney, Agent, or Firm—Mark L. Becker; Peter J. Meza

[57] ABSTRACT

A trigger circuit for detecting plural simultaneous input signals and generating a trigger signal in response thereto includes a word recognizer and a state machine. The word recognizer reconstructs each input signal in response to predetermined high and low threshold voltage logic levels and the input signal. The reconstructed signals indicate the input signal's logic level above the high threshold level, below the low threshold level, and transitionally between the high and low logic levels. The trigger circuit provides both clock-based and time-based trigger modes. The clock-based trigger modes include single event triggering, nested event triggering, and consecutive and exception event triggering. The time-based trigger modes include these modes and in addition setup and hold-time triggering, transition time triggering, and sliver pulse triggering.

24 Claims, 24 Drawing Sheets

CLK

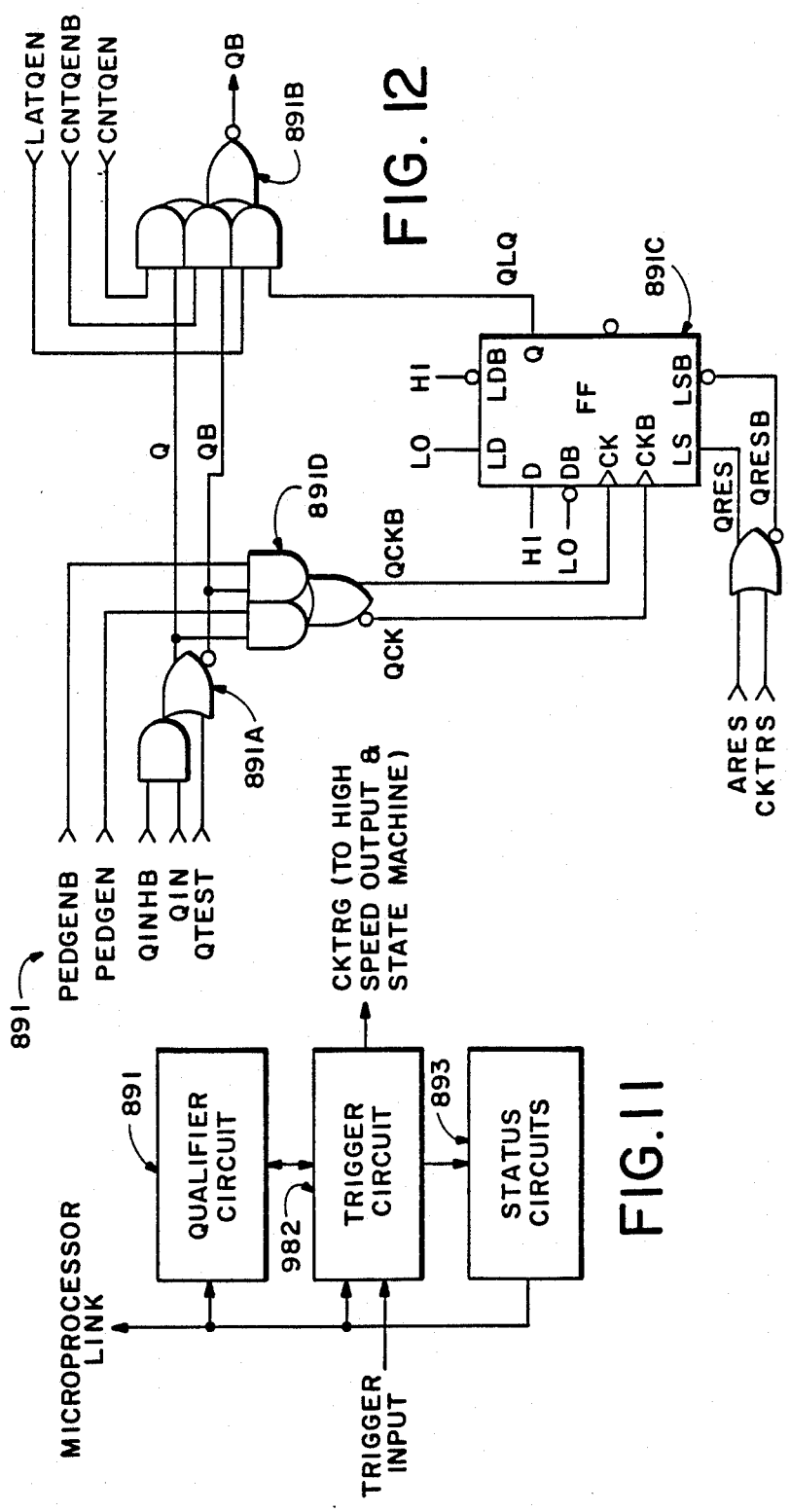

METHOD AND APPARATUS FOR TRIGGERING

TECHNICAL FIELD

This invention relates to electronic triggering devices, and more particularly to triggering devices for detecting and displaying the analog characteristics of multiple simultaneous signals.

BACKGROUND OF THE INVENTION

The design of electronic circuits has become increasingly complex with the advent of microprocessor-based systems. Troubleshooting such circuits demands instruments that can capture simultaneous digital signals and display their analog characteristics. Conventional oscilloscopes that are quick enough to view the subnanosecond pulses of these signals lack the capability to trigger on a combination (referred to as a word) or series of combinations of these signals. Logic analyzers, on the other hand, excel at triggering on words. But they lack an oscilloscope's ability to display the voltage and timing characteristics of the digital signals that form the word.

Several attempts have been made to address this demand by incorporating the measurement capability of the oscilloscope and the recognition capability of the logic analyzer into a single device. Devices of this type include the 7A42, an oscilloscope logic triggered amplifier manufactured by Tektronix, Inc., of Beaverton, Oreg., and now the subject of U.S. patent application Ser. No. 06/487,398, now U.S. Pat. No. 4,585,975; the Microanalyst, a timing analyzer manufactured by Northwest Instruments, Inc., of Beaverton, Oreg.; and the 54100D, a digital oscilloscope manufactured by Hewlett-Packard Company of Palo Alto, Calif. These devices vary from each other primarily in the triggering modes they offer.

The 7A42 is designed to trigger on a single word or a nested sequence of Boolean words and to display the corresponding analog characteristics of the signals that form each word. In the single word combination of inputs, it can trigger either immediately on the appearance of a predetermined combination or after the combination has persisted for a predetermined time. In the nested mode, it triggers on the appearance of a sequence of a first predetermined combination followed immediately by a second predetermined word combination.

The Microanalyzer lacks an analog display of the digital signals but offers other triggering modes not found in logic analyzers or the 7A42. In addition to the single word and nested triggering modes, it can trigger on a digital signal that is detected between predetermined logic levels within a predetermined time of a clock pulse.

The 54100D offers analog signal display capability and includes several triggering modes not available in the instruments above. Like the logic analyzer and other devices, it can trigger on a single word, both immediately and after the word's persistence for a predetermined time. The 54100D can also detect and trigger on a narrow pulse, or glitch, and display the pulse's analog characteristics. In addition, it can be set to trigger after the occurrence of a predetermined number of events or a predetermined time. However, it cannot trigger on nested sequence of word combinations without the aid of a logic analyzer.

These devices are great improvements over what was previously possible with a conventional logic analyzer or oscilloscope. But they lack the capability of triggering in many other circumstances where it is desirable to view the analog characteristics of the signals within a system. For example, none of them can detect and display the analog characteristics of a plurality of digital signals transitionally between high and low logic levels. Nor can they detect a sequence of a first predetermined word combination followed by one of two second predetermined combinations. They also cannot detect a sequence of a first predetermined combination followed by the absence of one of two second predetermined combinations. And none of these devices offers all these triggering modes in a single device that can monitor up to eight input signal channels simultaneously.

SUMMARY OF THE INVENTION

It is an object of the invention to provide a triggering device that offers a plurality of triggering modes for measuring the analog characteristics of input signals.

A second object of the invention is to provide a triggering device that can detect up to eight simultaneous input signals.

A third object of the invention is to provide a triggering device that can detect the high, low, and transistion logic levels of input signals.

Another object of the invention is to provide a triggering device that can detect the transition logic level on an input signal within a predetermined time of a clock pulse.

Yet another object of the invention is to provide a triggering device that can detect a first predetermined combination of input signal logic levels followed by the presence or absence of a second predetermined combination.

To achieve these objects, a trigger circuit for detecting plural analog input signals includes logic level discrimination means for reconstructing each input signal into a number of digital signals and trigger event detection means for detecting in the digital signals a triggering event. The logic level discrimination means reconstructs each input signal in response to predetermined first and second threshold levels to describe the input signal's logic level above the first threshold level, below the second threshold level, and transitionally between the first and second levels. The triggering event detected by the detection means includes at least one predetermined combination of input signal logic levels. Upon detection of the triggering event, the trigger circuit generates a trigger display signal.

In this embodiment of the invention, the predetermined first and second threshold logic levels are voltage levels that are selectably adjustable and are generated by threshold voltage generator means.

The trigger event detection means can detect triggering events in both clock-based and time-based triggering modes. The clock-based modes include single event triggering, nested triggering, and consecutive and an exception triggering. In the consecutive mode, the detection means detects a sequence of a first predetermined combination of input signal logic levels followed immediately by one of two second predetermined combinations. In the exception mode, the detection means detects sequence of a first predetermined combination of input signal logic levels followed immediately by the absence of a second predetermined combination.

In the time-based triggering modes, a user-definable time window is provided for detecting predetermined combinations. For the timed-consecutive mode, the detection means detects a first predetermined combination lasting for a predetermined time followed by one of two second predetermined combinations within a predetermined window of time. For the timed-exception mode, the detection means detects a first predetermined combination lasting for a predetermined time followed within a predetermined time window by the absence of a second predetermined combination. Other modes include setup time or hold time violation modes. In these modes, the detection means detects the transition logic level of an input signal occurring within a predetermined time of a clock pulse detected on another input signal. In a sliver detection mode, the detection means detects on an input signal an excursion from and the return to a predetermined logic level, the excursion and return occurring within a predetermined time window. And in a transition time violation mode, the detection means detects a transition logic level on an input signal enduring greater than or less than a predetermined time.

In this embodiment, the detection means comprises a word recognizer for recognizing predetermined combinations of input signal logic levels and a state machine for time-qualifying the combinations recognized by the recognizer. The detection means may also include a trigger filter for filtering out internally-generated signals of less than a predetermined duration.

The foregoing and other objects, features, and advantages of the invention will become more apparent from the following detailed description of a preferred embodiment which proceeds with reference to the accompanying drawings.

DESCRIPTION OF THE DRAWINGS

FIG. 11 is a subblock diagram of the clock mode block.

FIG. 12 is a schematic diagram of the qualifier subblock of the clock mode block.

DETAILED DESCRIPTION

A Functional Overview

Figure 1:
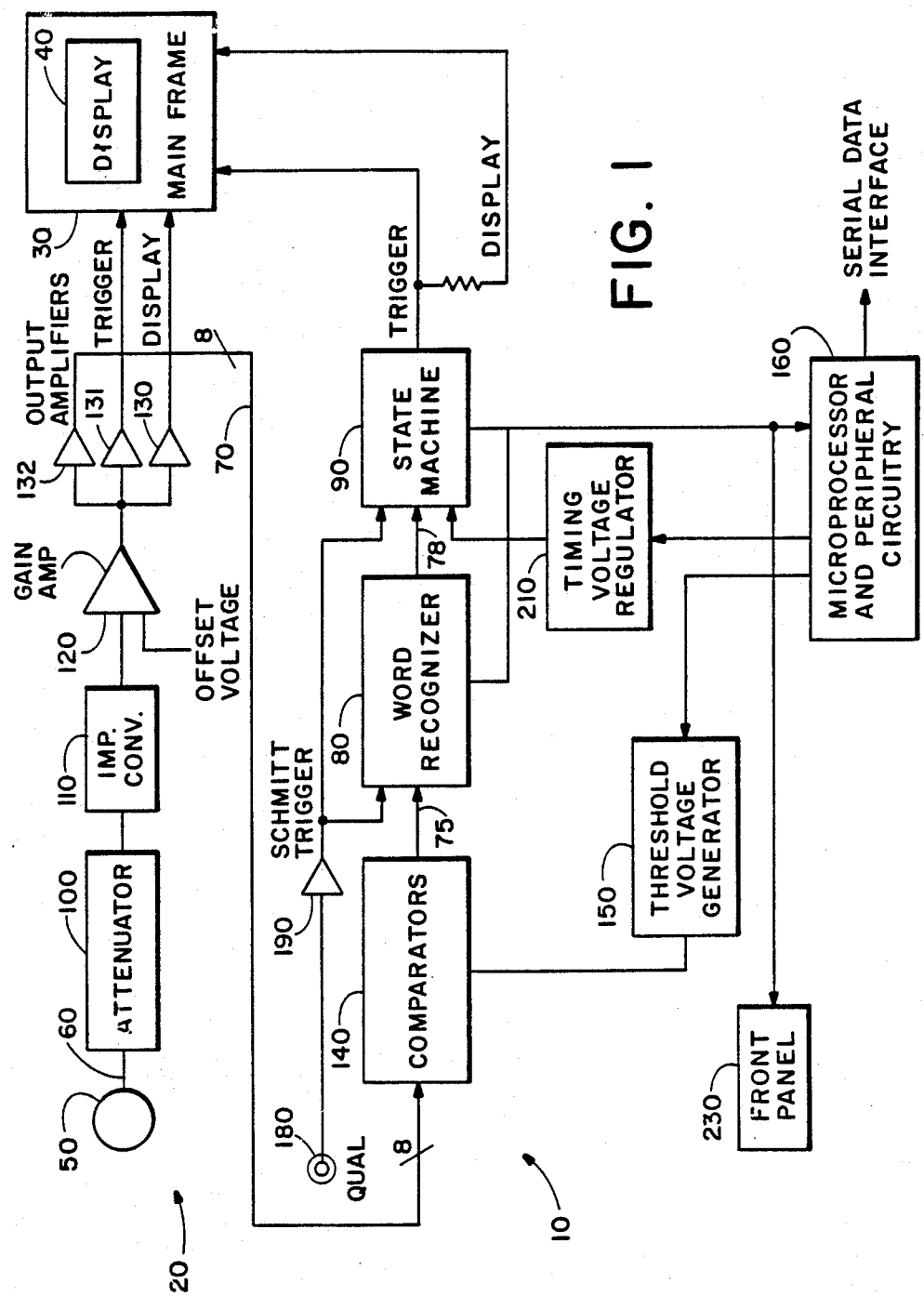
FIG. 1 is a block diagram of the preferred embodiment of the present invention.

FIG. 1 shows a block diagram of a trigger 10 in association with input signal circuitry 20 and a real-time oscilloscope main frame 30. The mainframe 30 includes a visual display 40. The associated circuitry is for illustration only. The trigger is not limited in use to a signal acquisition instrument having an integral display, such as an oscilloscope, but may be used in other instruments as well.

The input signals to be examined are picked up by probes 50 on input circuitry 20. From the probes, the signals travel along an analog signal path 60 to a visual display 40. These signals may be digital or analog in nature; what is displayed is the analog characteristics of each signal. A signal path 70 branches from the analog signal path to direct the analog signals also through the trigger 10. If the logic levels of the analog signals match trigger conditions set by the selected triggering mode, the trigger produces a trigger signal that triggers the display of the corresponding analog signals.

Considering FIG. 1 in more detail, analog input signal circuitry 20 is of conventional design and present in a separate unit connected to oscilloscope mainframe 30. For clarity, only the circuit elements of one of eight independently controllable input signal channels is depicted, with the eight channels represented by the appropriate notation on line 70. Each input signal detected by probe 50 passes through an attenuator 100 that proportionally attenuates the strength of the input signal. From there, each input signal travels through an impedance converter 110 to maximize signal transfer and a gain amplifier 120 which converts each input signal to a differential signal pair. The analog path branches beyond the gain amplifier 120 through three output amplifiers 130, 131, and 132 that buffer each input signal to provide separate, isolated outputs. One branch through output amplifier 130 provides a display signal to mainframe 30, a second branch through output amplifier 131 forms a separate trigger signal, and a third branch through the output amplifier 132 directs each analog signal along line 70 to trigger 10.

Upon entering the trigger 10, each input signal (a differential pair) encounters logic level discrimination means comprising a comparator circuit 140 and an input portion of a word recognizer 80. The comparators 140 compare the input signal against first and second predetermined threshold voltages. The first voltage corresponds to a high logic level, and the second level is lower than the first, corresponding to a low logic level. The output of each comparator forms two differential pairs of digital signals that encode the input signal's logic level relative to the threshold voltages. The threshold voltages levels are adjustable, set by a threshold voltage generating means 150 such as a digital-to-analog converter under the control of a microprocessor 160. Threshold voltages may be selected that correspond to high and low logic levels of different logic families such as TTL, ECL, or CMOS or may be independently entered by command. Each differential pair is sent along a connecting path 75 to the word recognizer 80. There they are each initially decoded into three separate digital signals that describe the logic level of the input signal above (H), below (L), and transitionally between (T) the predetermined first and second threshold voltage levels.

The word recognizer 80 receives the digital signals and detects whether a triggering event such as a predetermined combination of input signal logic levels is present. The triggering event depends on the triggering mode selected (described herein), which typically includes a predetermined combination of input signals on the input lines. The predetermined combination or combinations is set within word recognizer 80 by microprocessor 160. An example of such a combination on eight input channels might be:

| 8 | 7 | 6 | 5 | 4 | 3 | 2 | 1 | (1) |
|---|---|---|---|---|---|---|---|---|
| H | H | L | T | / | T | H | X | | where H represents a logic level above the predetermined high voltage threshold, L represents a logic level below the predetermined low voltage threshold, and T represents a transition logic level between the high and low voltage threshold levels. An "X" indicates that a channel is excluded from determination of the combination (a "don't care"). A "/" indicates that the channel is selected as a clock and that the recognizer 80 evaluates each input combination on the rising clock edge of that channel. The recognizer can also evaluate the combination on a falling clock edge. If recognizer 80 recognizes the input combination, it generates a recognition signal that is transmitted to the state machine 90. If the triggering event is several predetermined combinations, a plurality of recognition signals are generated.

Generation of the recognition signals may be qualified by a qualifier (Q) signal 180 that originates at a logic analyzer or similar device monitoring events in the digital system being analyzed. Q, which is generated by a separate event in that system, is used to restrict the occasions on which a trigger event is detected. To sharpen the signal characteristics of Q, it is passed through a Schmitt trigger 190 before reaching recognizer 80. Recognizer 80 and state machine 90 may be set by command to be either level or edge sensitive to Q.

The recognition signals are sent from the word recognizer 80 to state machine 90 along a connecting path 78. The state machine 90 and the word recognizer 80 form a triggering event detection means in the circuit 10. The state machine 90 detects a predetermined sequence of recognition signals within predetermined time windows and measures the duration of the recognition signals. As with recognizer 80, the trigger conditions within the state machine are set by the selected triggering mode through the microprocessor 160 and qualified by Q 180. The state machine also receives analog voltage input from a timing voltage generator 210 that calibrates the frequency of timing apparatus within the machine. Generator 210 generates its voltage signal in response to digital input from microprocessor 160.

If the trigger mode selected is clock-based, as in the example (1), the recognition signals are routed through the state machine without further processing to the trigger output. If the trigger mode is time-based, the signals are evaluated within the state machine for the duration and sequence called for by the triggering mode. For example, the mode may specify that the predetermined combination above must exist for a predetermined time:

| 8 | 7 | 6 | 5 | 4 | 3 | 2 | 1 | (2) |
|---|---|---|---|---|---|---|---|---|
| H | H | L | T | T | T | H | H | >50 nanoseconds |

If the trigger conditions are satisfied, state machine 90 generates a trigger signal to mainframe 30. The trigger signal itself may be displayed along with the analog input signals and other information captured by the triggering mode.

Choice of triggering mode is made at a control means such as a front panel 230 that communicates with the trigger circuitry through microprocessor 160. The modes include four clock-based: single, nested, consecutive, and exception; and eight time-based: single, nested, consecutive, exception, and setup, hold, sliver, and transition. The operation of each is described in detail below.

The Circuit Design

The design of the trigger 10 is best understood by reference to FIGS. 1 through 19 and the following description of each circuit component.

Microprocessor Control 160

The microprocessor and its peripheral circuitry are of conventional design. In this embodiment, an 80C88 microprocessor and its family of memory and buffer circuits is used. Signals from microprocessor 160 are sent to recognizer 80, state machine 90, and the other circuit portions of trigger 10 through conventional data buses, buffers, and control logic (not separately shown) associated with the microprocessor.

Figure 20:
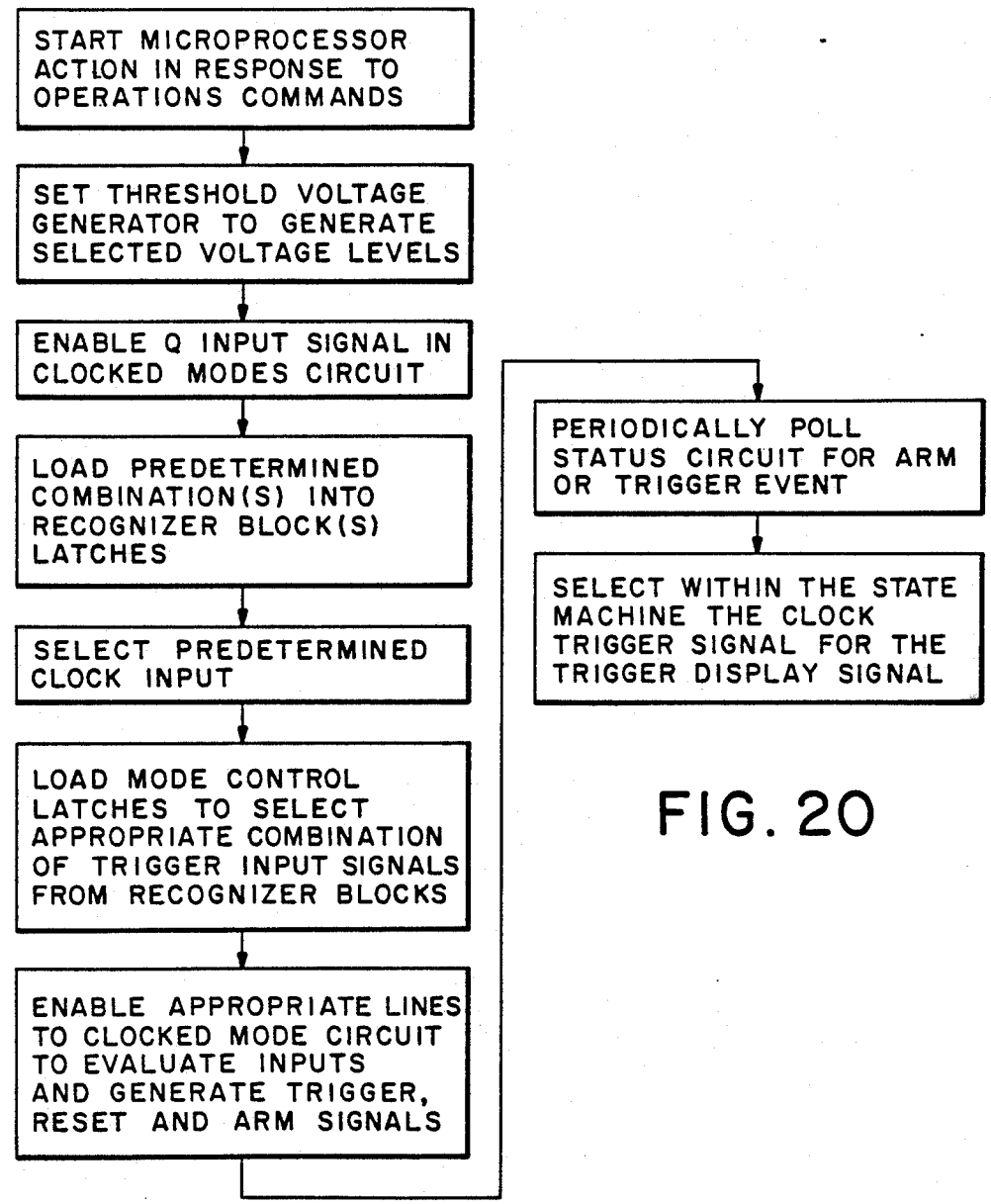
FIG. 20 is a flowchart of microprocessor operation in clock-based triggering modes.
Figure 25:
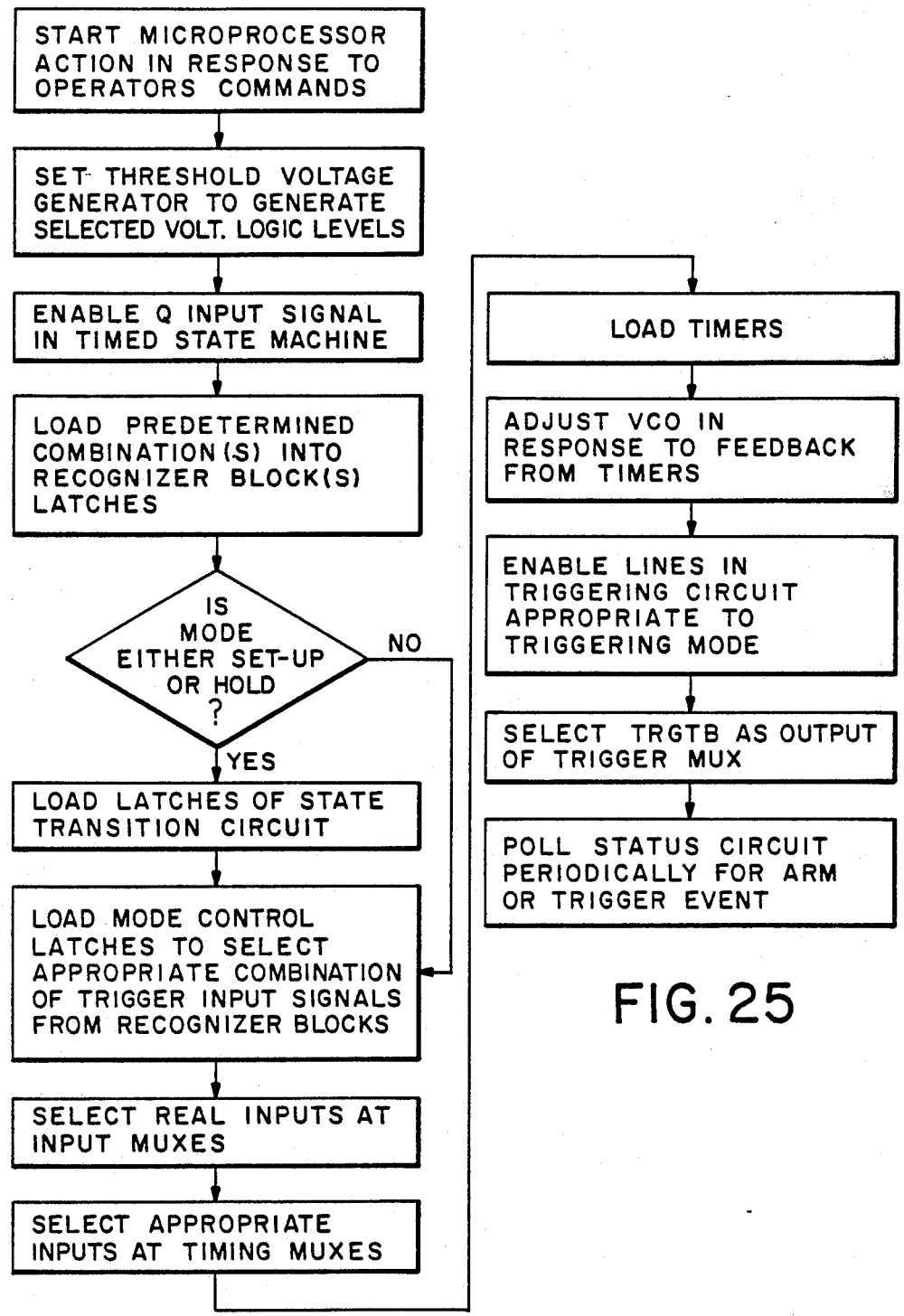
FIG. 25 is a flowchart of microprocessor operation in time-based triggering modes.

The operation of microprocessor 160 is illustrated by flowcharts in FIGS. 20 and 25. The order of steps within each flowchart is for illustration only. The exact order may be varied without affecting the trigger's operation. The flowcharts are discussed in conjunction with the operation of the triggering modes.

Threshold Voltage Generator 150

The threshold voltage generator comprises a digital-to-analog converter (DAC) controlled by and receiving digital signals from the microprocessor 160. The DAC generates corresponding first (high) and second (low) analog threshold voltage signals, the second being lower than the first, for eight input channels. Generator 150 may be implemented by a number of means, the DAC here being a means for illustration only. The microprocessor-originated signal is a binary number that represents the predetermined analog high and low threshold voltages, VTH and VTL, to be sent to comparator circuit 140. Independent high and low threshold voltages are provided for each input differential signal pair, as shown in FIG. 2.

Comparator Circuit 140

Figure 2:
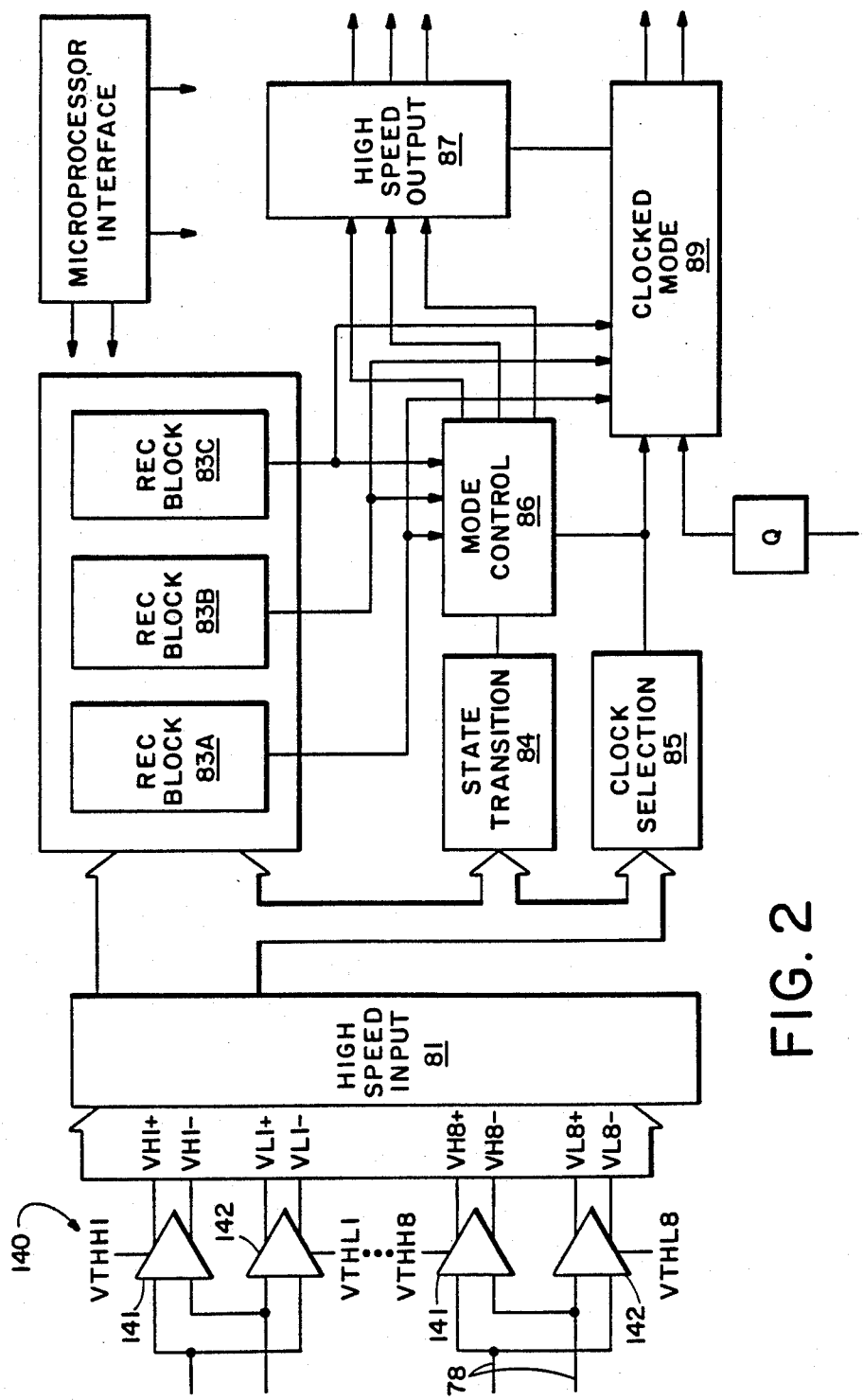
FIG. 2 is a schematic diagram of the comparator circuitry and a block diagram, of the word recognizer of FIG. 1.

A portion of comparator circuit 140 corresponding to one differential input signal pair 78 is shown in detail in FIG. 2. The signal pair is routed to a pair of comparators 141 and 142. At comparator 141 the signal pair 78 is compared with VTH8, and at comparator 142 the pair is compared with VTL8. Each comparator reconstructs the input signal pair 78 into digital differential signal pairs that indicate whether the analog input signals exceed the corresponding threshold voltage level input. If the voltage of the input signal pair 78 exceeds both VTH8 and VTL8, signals VH8+ on comparator 141 and VL8+ on comparator 142 are high and signals VH8− on comparator 141 and VL8− on comparator 142 are low. If the input signal voltage exceeds only VTL8, then VH8+ is low and VH8− is high on comparator 141, but VL8+ remains high and VL8− remains low on comparator 142. The two differential pairs of signals VH8+, VH8− and VL8+, VL8− thus digitally encode the relative voltage logic level of the input signal pair 78.

The comparator circuitry makes up one part of the logic level discrimination means of trigger 10. The other part comprises the high speed input 81 which is the input portion to word recognizer 80.

Word Recognizer 80

A block diagram of word recognizer 80 appears in FIG. 2. The function and operation of each block is discussed below.

1. High Speed Input 81

Figure 3A:
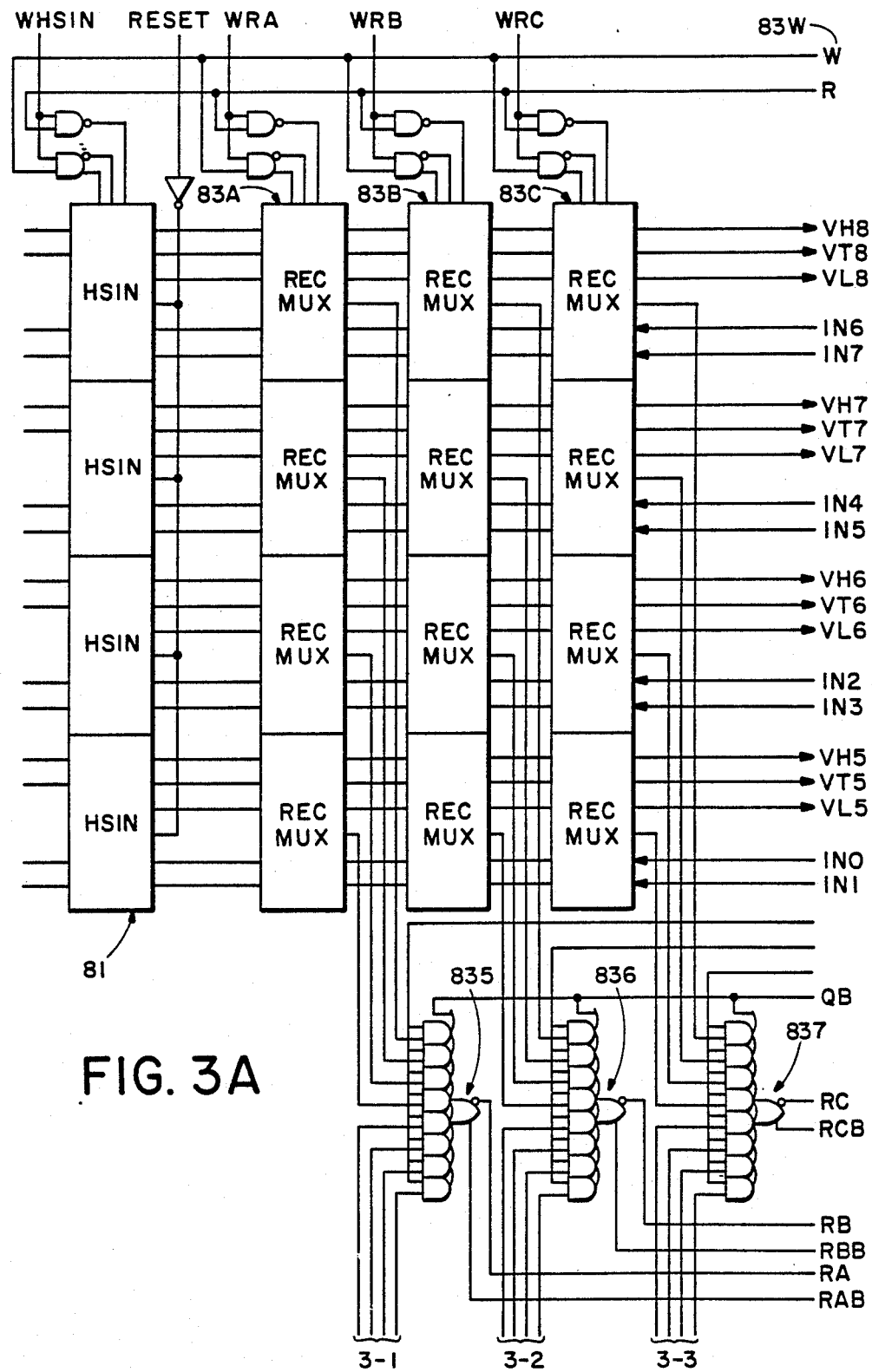
FIGS. 3a and 3b are a schematic diagram of the high speed input and recognizer blocks of FIG. 2.
Figure 3B:
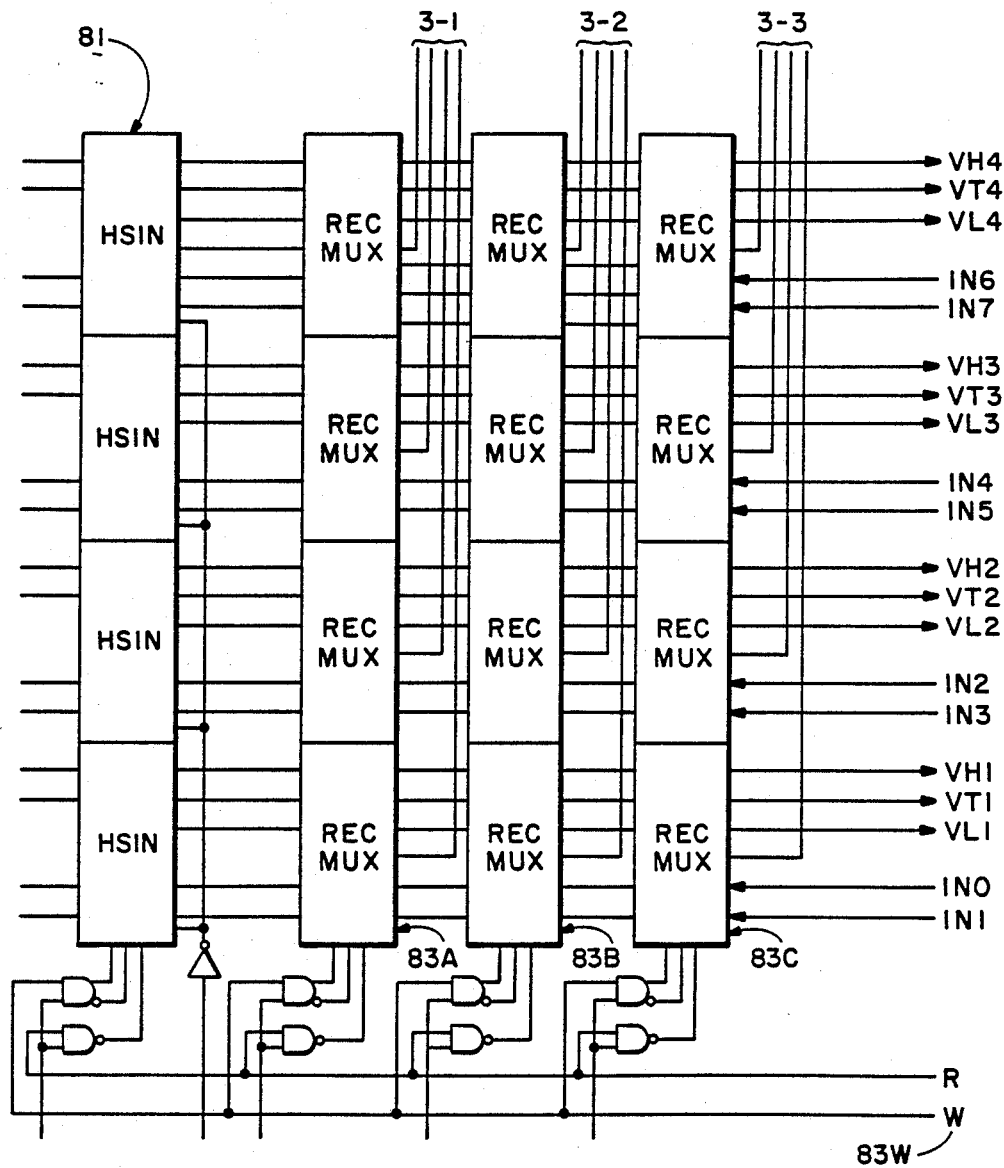
Figure 4:
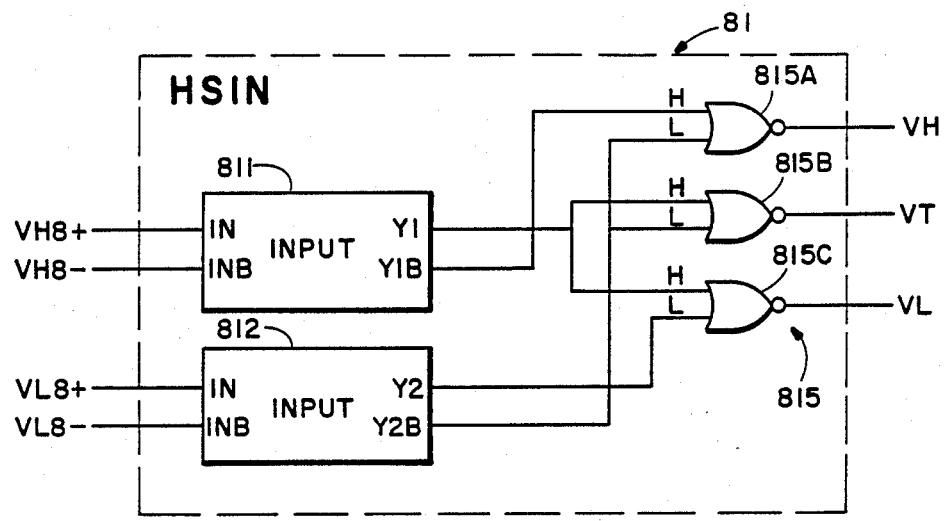
FIG. 4 is a schematic diagram of the high speed input block of the word recognizer.

The high speed input (HSIN), which appears at the left of the block diagram of FIG. 2, is shown in context in FIG. 3 and in detail in FIG. 4. Referring to FIG. 4, the two differential pairs of signals VH8+, VH8− and VL8+, VL8− enter a pair of buffers 811, 812 and are routed therefrom to a decoder 815. Decoder 815 decodes the comparator signals into three separate outputs VH, VT, and VL that correspond to the possible logic levels of the input signal pair 78. The decoder 815 is of conventional design, constructed of NOR gates 815A through 815C. If the input signal voltage is above the high voltage threshold level, VTH8 for example, VH is high. If the input signal voltage is between VTH8 and VTL8, VT is high. Only one of the logic level lines VH, VT, VL can be high for each input signal voltage.

Referring again to FIG. 2, the VH, VT, and VL signals are routed to recognizer blocks 83A, 83B, 83C. VT is routed alone to a state transition block 84. And VH and VL are routed to a clock selection block 85 for further processing.

2. Recognizer Block 83A

Figure 5:
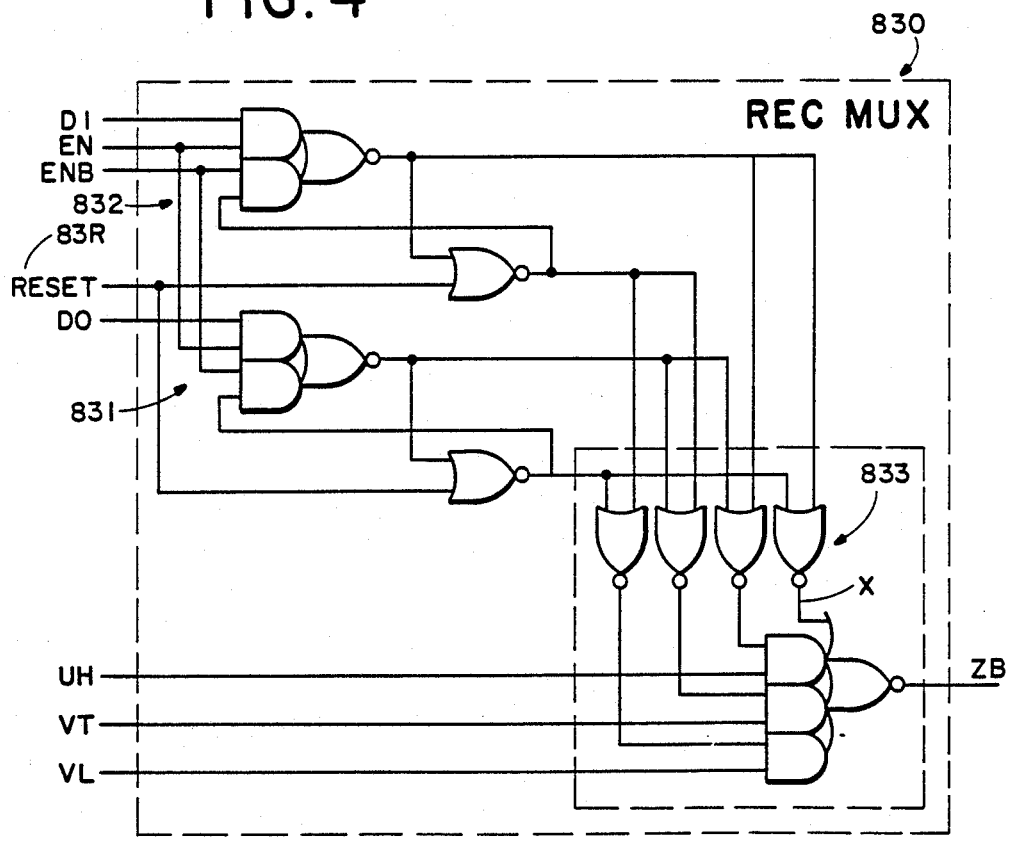
FIG. 5 is a schematic diagram of a recognizer multiplexer that forms the recognizer block.

Recognizer block 83A is shown in detail in FIG. 3, with the circuit diagram of an individual latched multiplexer 830 within the recognizer block shown in FIG. 5. Recognizer blocks 83B and 83C are of similar design. Recognizer block 83A comprises eight latched multiplexers 830 that include latches 831, 832 and a multiplexer 833. Referring to FIG. 5, the latches 831, 832 receive signal select data from microprocessor 160 on lines D0 and D1 to select which of VH, VT, VL or the don't care (X) signals is to be multiplexed. The data is stored in the latches when enabled by lines EN, ENB.

Multiplexer 830 enables the selected signal VH, VT, VL, or X, and transmits its inverted output on line ZB. If the selected signal is present, ZB is low.

FIG. 3 shows in circuit context high speed input 81 and recognizer blocks 83A, 83B, 83C. The signal select data for multiplexers 830 are carried along the lines IN0 through IN7 from the microprocessor, originating at the far right of the figure and passing through each recognizer block to the left. VH, VL, and VT originate at the outputs of high speed inputs 81 and are passed through each recognizer, from left to right across the figure. Acceptance by a recognizer of the data signals is controlled by the enabling lines EN, ENB, which are tied to write lines 83W of the microprocessor, shown at the top an bottom of FIG. 3. With this arrangement, each recognizer can be individually configured to recognize a different predetermined combination of input signal levels.

When a predetermined combination is detected by a recognizer block, it generates recognition signals. The recognition signals are formed by ANDing ZB from each multiplexer 833 in the block with the qualifying signal QB and then NORing them together in selectors 835, 836, or 837. The output is generated on recognition lines RA, RAB . . . RC, RCB. The recognition lines connect to a mode control circuit 86, at which the recognition signals required for a specific triggering mode are selected.

3. State Transition Circuit 84

Figure 6:
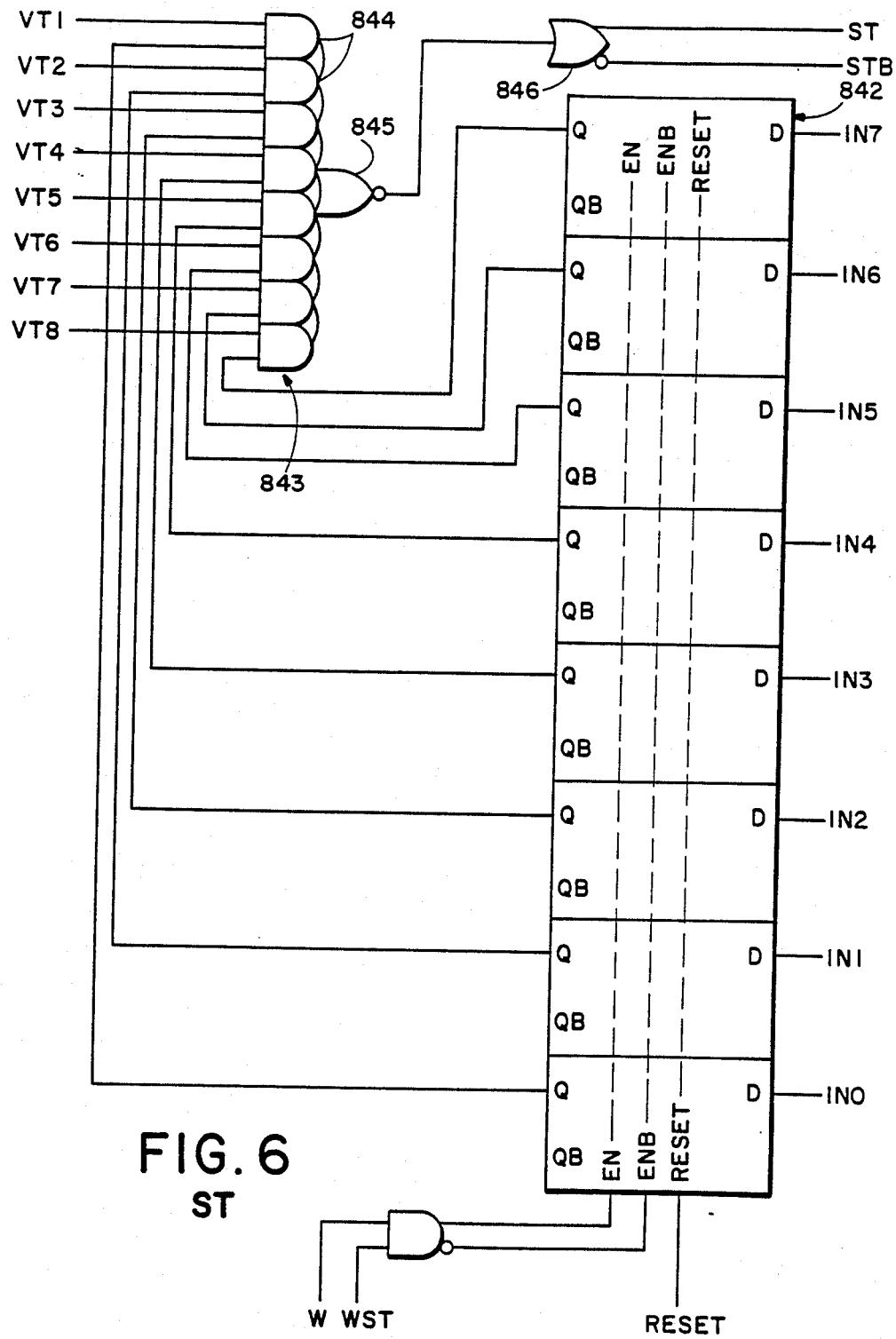
FIG. 6 is a schematic diagram of the state transition block.

State transition circuit 84 detects the transition logic levels of one or more input signals VT of a predetermined combination. Referring to FIG. 6, the circuit comprises a register of latches 842 and a selector circuit 843. Latches 842 receive data signals from microprocessor 160 on input lines IN0 through IN7 to select the input channels desired and also receives control signals on lines EN, ENB to control the operation of the latches. The outputs of latches 842 enable or disable AND gates 844 within selector 843 so that the signal on selected VT lines can be passed through. If any of the selected VT lines is high, the output of NOR gate 845 is low. The ST output on the following NOR gate 846 is then low, and STB is high when a transition level is detected.

The output of the state transition circuit, ST and STB, is sent to mode control 86 which selects it in several of the time-based triggering modes.

4. Clock Selection Circuit 85

Figure 7:
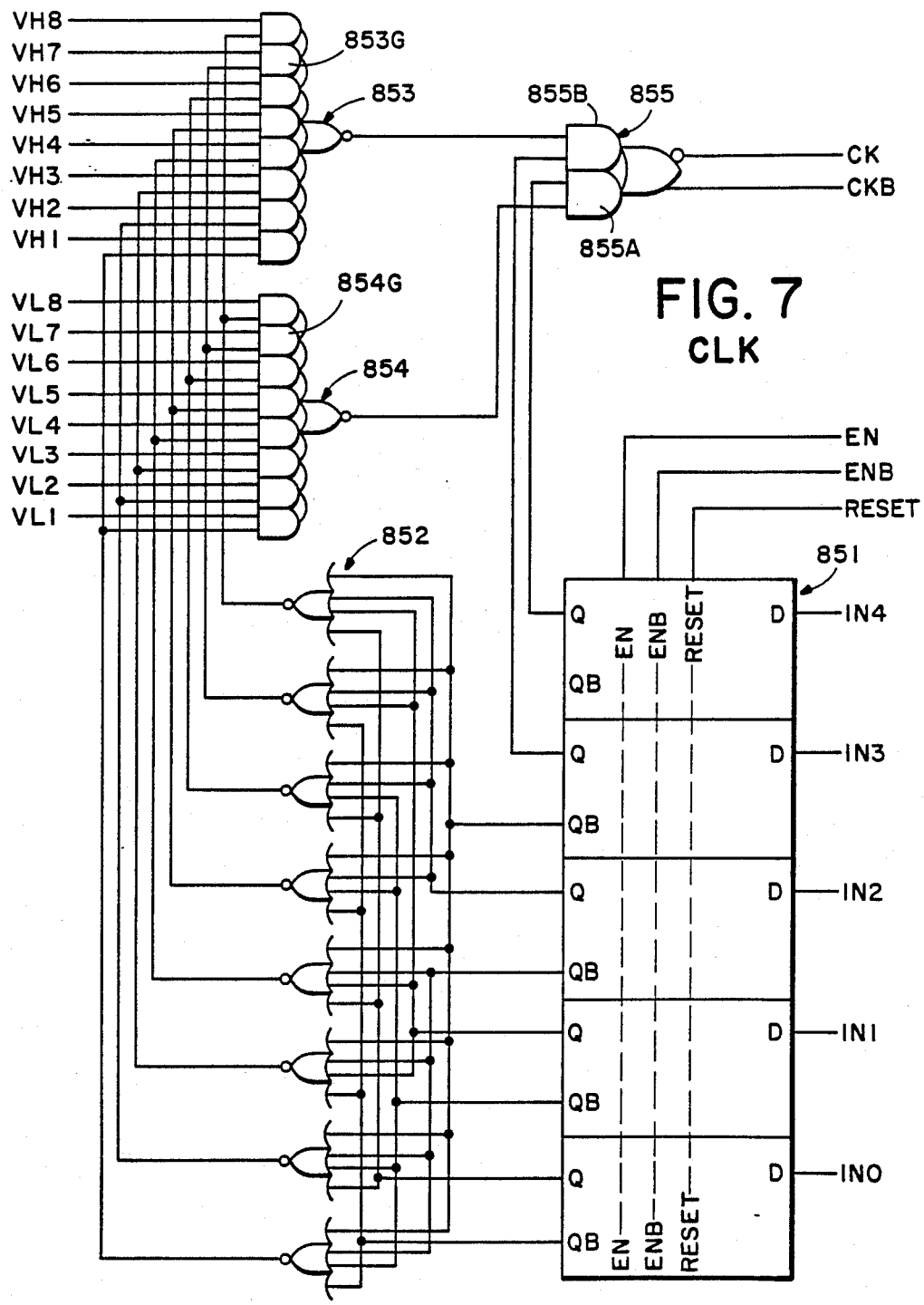
FIG. 7 is a schematic diagram of the clock circuitry block.

The clock selection circuit, shown in FIG. 7, selects an input line as the clock for a predetermined combination, and a rising or falling edge for the clock. As in state transition circuit 84, a register of latches 851 receives selection data signals from microprocessor 160 on input lines IN0 through IN4 and control signals on lines EN, ENB. The selection data are gated through the latches to a decoder 852, which decodes the data and enables a single pair of lines VH, VL entering data selectors 853, 854. The inverted outputs of these selected lines are then directed to a second stage selector 855, at which the rising (VH) or falling (VL) edge of the clock is chosen. For example, a rising clock on channel 7 is detected by disabling all AND gates except 853G and 855B. If the positive edge occurs, the output of selector 853 goes low into selector 855. AND gate 855B is enabled, causing line CK to go high and CKB to go low, indicating the presence of the clocking input. If the falling clock edge was chosen, AND gate 854G and AND gate 855A would instead be enabled.

The outputs of clock circuit 85 are routed to mode control 86 and high speed output 87.

5. Mode Control 86

Figure 8:
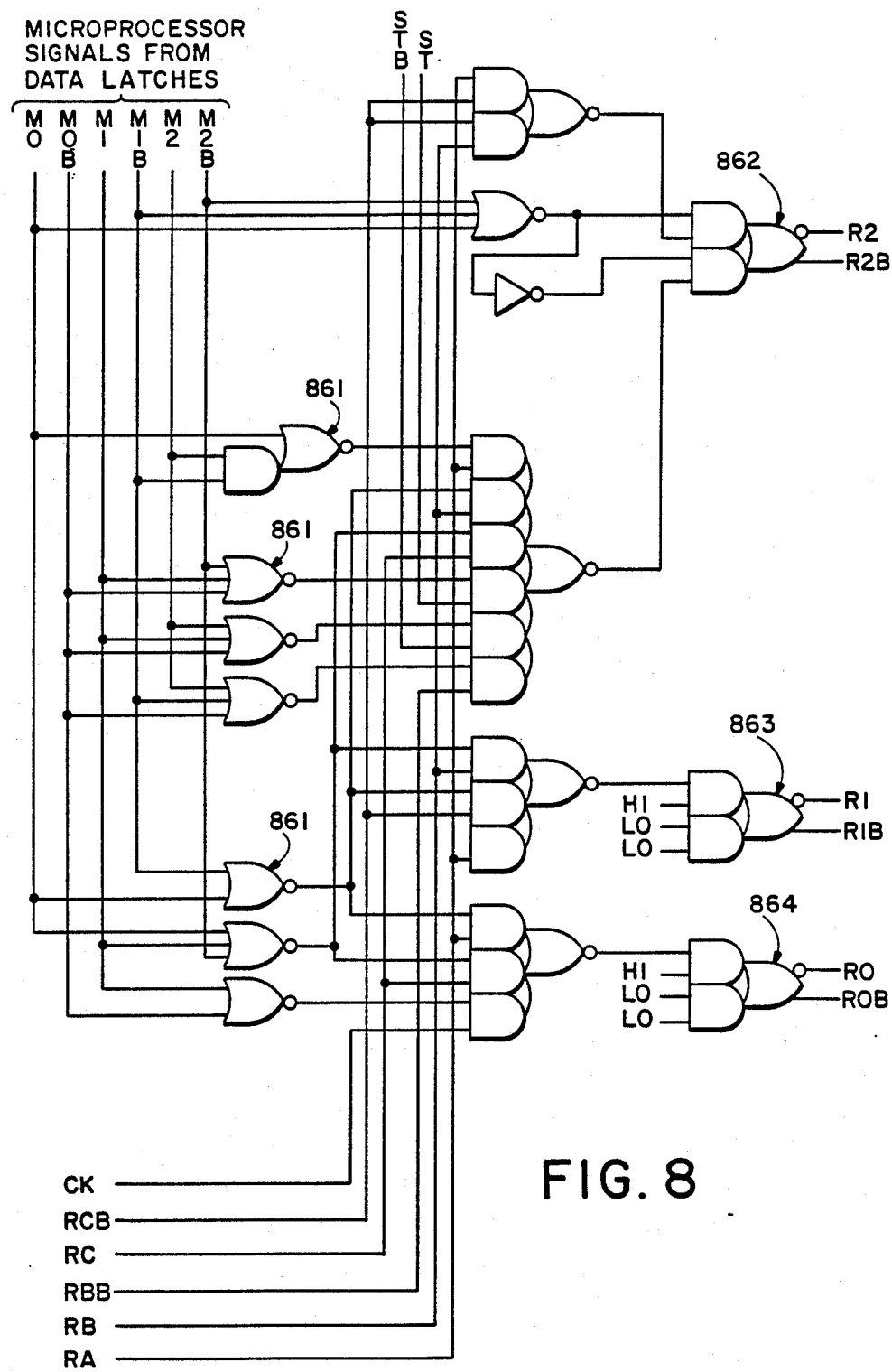
FIG. 8 is a schematic diagram of the mode control block.

Mode control 86 is shown in FIG. 8. It acts as a multiplexer that selects the trigger inputs required for a selected trigger mode. These trigger inputs include lines CK from clock circuit 85; ST, STB from state transition circuit 84; and the recognition signals from recognizers 83A, 83B, 83C. Data lines M0 through M2B from latches (not shown) provide the data signals from microprocessor 160 to select the combinations of trigger inputs corresponding to a selected triggering mode. These data signals are decoded in a series of NOR gates 861 and selector circuits 862, 863, and 864. With the appropriate gates enabled, different combinations of the trigger inputs can be selected, corresponding to the chosen trigger mode. The outputs R0, R0B ... R2B of the selectors are transmitted to the high speed output 87.

6. High Speed Output 87

Figure 9:
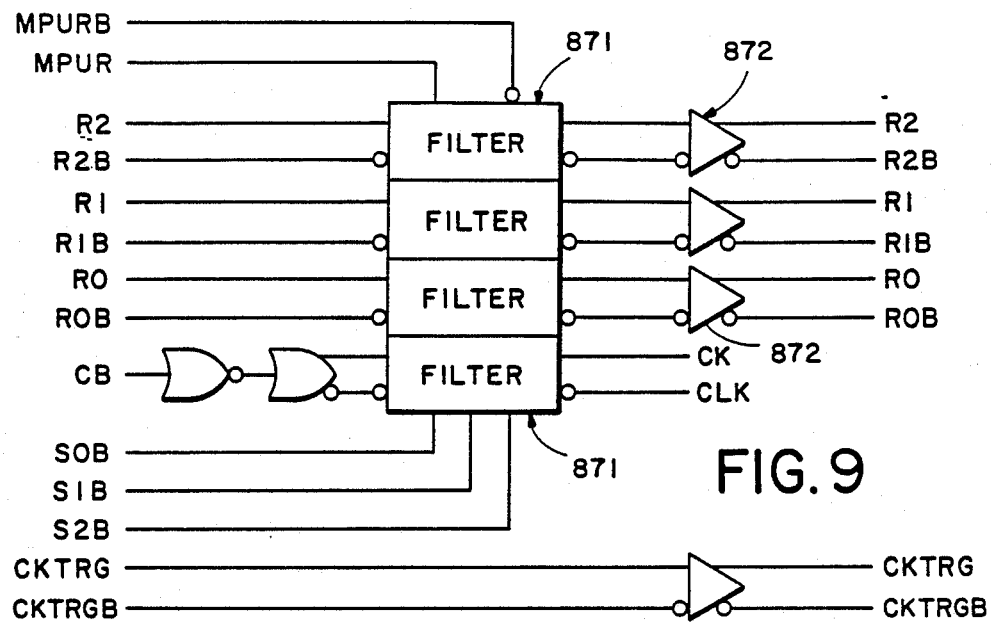
FIG. 9 is a schematic diagram of the high speed output block.
Figure 10:
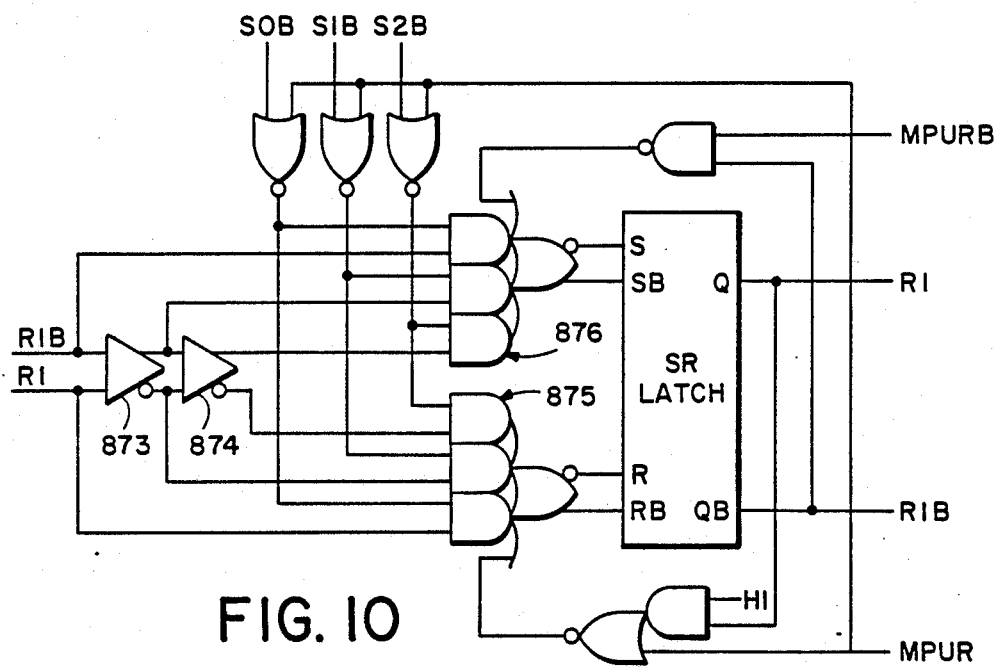
FIG. 10 is a schematic diagram of the filter circuitry of the high speed output block.

High speed output 87 is shown in FIG. 9 and, in more detail, in FIG. 10. As shown in FIG. 9, the high speed output receives the outputs R0, R0B ... R2B from the mode control, passes them through filters 871, and routes them through amplifying drivers 872 to state machine 90. Filters 871 are present to filter out false signals that may have been generated internally within the system of circuits, amplifiers, and other components of the trigger 10. The output 87 also transmits and amplifies the CKTRG, CKTRGB signals from the clocked mode circuit 89 to the state machine 90, as described below.

Referring to FIG. 10, a filter for lines R1, R1B is shown in detail. R1, R1B are gated through two drivers 873, 874 in series to introduce two delays into the signal's progress. The three signals—the original and each delayed signal—then enter AND-NOR gate combinations 875 for R1 and 876 for R1B. The other input to each AND gate is controlled by a select line from the microprocessor. With an AND gate enabled by a select line, its output is NORed at NOR gates 875D, 876D with any other output enabled in that group and the inverted output of the respective NOR gate is sent to an SR latch 877. If R1 is of a predetermined duration, the SR latch will set, causing the R1 output to be high. If it is not long enough, latch 877 will reset, causing the output R1 to be low. The duration can be controlled by enabling different combinations of select lines.

For example, if R1 is less than 300 picoseconds in duration, it is considered internally generated and should be filtered out. If each driver 873, 874 introduces a delay of 150 picoseconds, then R1 will have to be at least 300 picoseconds in duration for all three inputs to AND gates 876 to be low at the same time. If they are, NOR gate 876 sets latch 877. If R1 is less than 300 picoseconds in duration, the previous setting is maintained.

THE MPUR, MPURB signals from microprocessor 160 allow the filter to be initialized for testing purposes.

7. Clocked Mode 89

In the clock-based trigger modes, a clock must appear simultaneously with Q signal 180 and the recognition signals, the only trigger inputs in these modes. It is in clocked mode 89 that this coordination occurs. Referring to FIG. 11, the clocked mode comprises three circuits: a qualifier circuit 891, a clock trigger circuit 892, and a status circuit 893.

a. Qualifier Circuit 891

As discussed above, qualifier signal Q 180 may be evaluated either on its edge or at a level. This is accomplished within qualifier circuit 891, shown in detail in FIG. 12. Q is selected by microprocessor 160 at gates 891A and directed to multiplexer 891B. For level triggering, high or low Q may be selected by enabling lines CNTQEN or CNTQBEN, respectively. For edge triggering, Q is enabled through edge-triggered latch 891C. PEDGEN and PEDGENB pass Q through gates 891D as a clock QCK, QCKB to latch 891C. QCK, QCKB will clock a high signal onto output QLQ as Q rises or falls, depending on whether the positive or negative edge was selected via PEDGEN, PEDGENB. LATQEN multiplexes QLQ through multiplexer 891B. The output of the multiplexer is then inverted as QB.

Because 891C is a latch, it must be reset after each output of QLQ. Reset is accomplished by strobe lines QRES and QRESB, which are controlled by CKTRG from clock trigger circuit 892.

b. Clock Trigger Circuit 892

Figure 13:
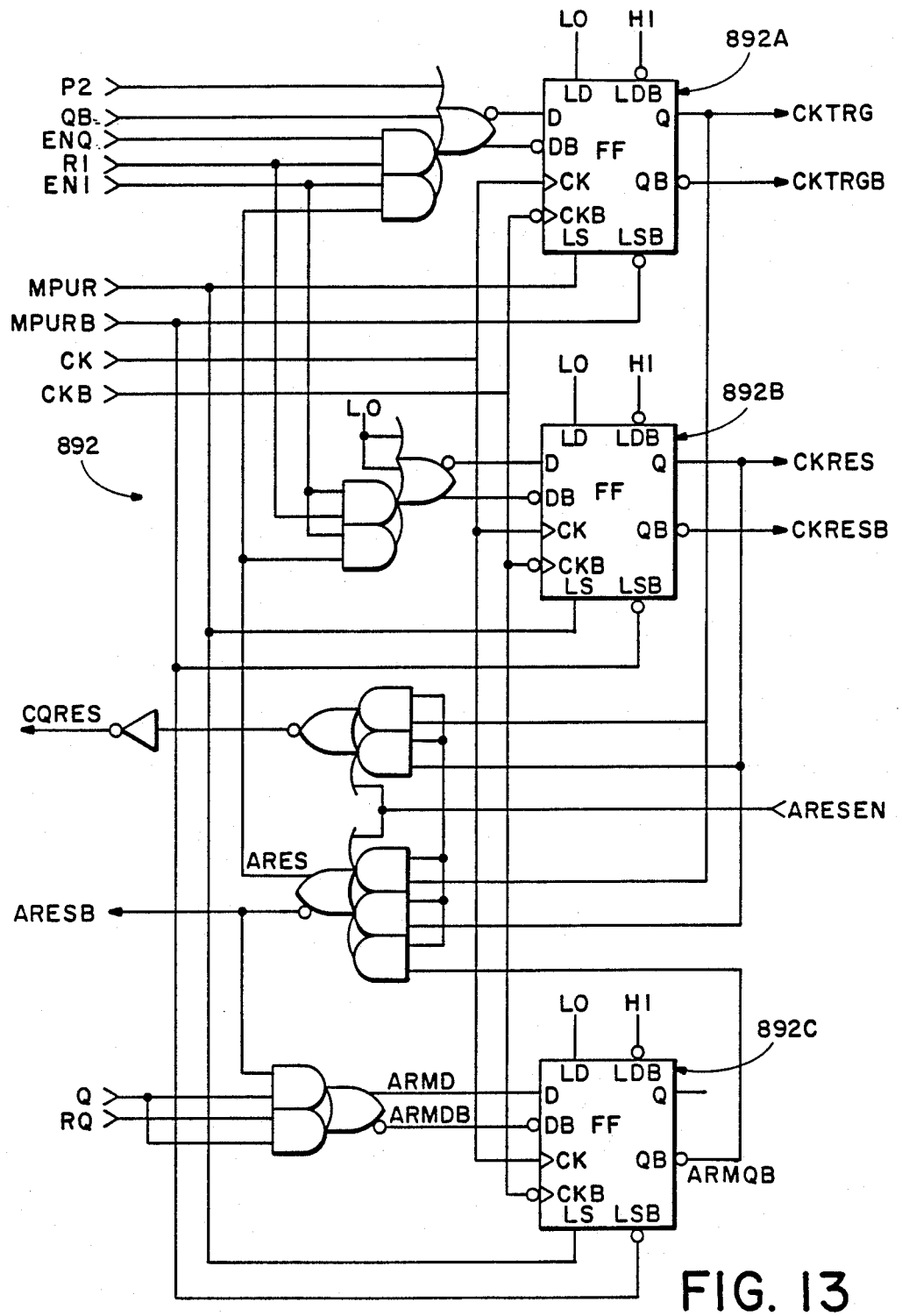
FIG. 13 is a schematic diagram of the clock circuit subblock of the clock mode block.

The clock trigger circuit is the trigger for clock-based triggering modes. Referring to FIG. 13, its inputs include the clock input from clock circuit 84, the recognition signals from recognizers 83A through C, and QB from qualifier circuit 891. The microprocessor controls the circuit's operation through lines EN0, EN1.

The circuit has three latches: trigger latch 892A, reset latch 892B, and arm latch 892C. The arm latch detects an initial combination that is an arming event. The reset latch detects a following combination that is a reset event, and the trigger latch detects a following combination that is a trigger event. The clock input to each latch is CK, CKB from clock circuit 85. The data inputs to trigger latch 892A are output signals from recognizers qualified by QB and enabled by microprocessor control lines EN0, EN1. The trigger latch's output is CKTRG and CKTRGB, the trigger signal. The data inputs to reset latch 892B are also outputs from the recognizers and Q. Its output CKRES resets Q, which disables the data inputs t trigger latch 891A. The data inputs to arm latch 892C are an output from recognizers qualified by Q. Its output is used to enable the reset latch and the trigger latch in several triggering modes.

Circuit 892 also generates signals that affect the operation of qualifier circuit 891 and status circuit 893.

CKTRG from the trigger latch 892A and CKRES from the reset latch 892B are fed back to circuit 891 to reset edge triggered latch 891C. ARESB is sent to status circuit 893 (FIG. 14) for relay to front panel 230 to show that an arming event or triggering event has been detected.

c. Status Circuit 893

Figure 14:
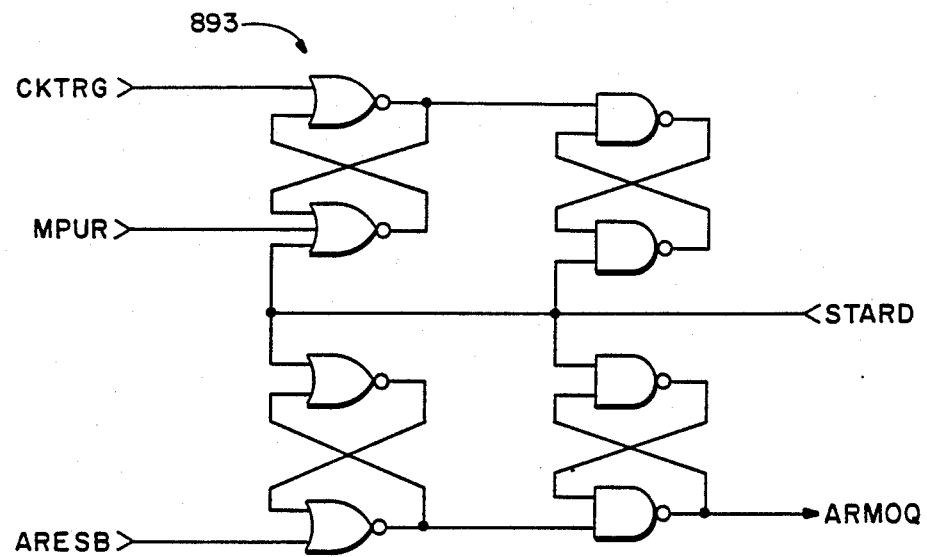
FIG. 14 is a schematic diagram of the status circuit subblock of the clock mode block.

The status circuit, as shown in FIG. 14, detects triggering or arming events to provide a status message which assists the user in operation of the instruments. The detected signal enters circuit 893 on lines CKTRG or ARESB from the trigger circuit 892 and is stored there by latches 893A through D. Periodically, microprocessor 160 polls the status circuit on line STARD to determine whether a triggering or arming event has occurred. That information is relayed to front panel 230 through the microprocessor 160 and the status circuit 893 is reset. The circuit may also be set for self test by microprocessor control on lines MPUR, MPURB.

State Machine 90

Figure 15:
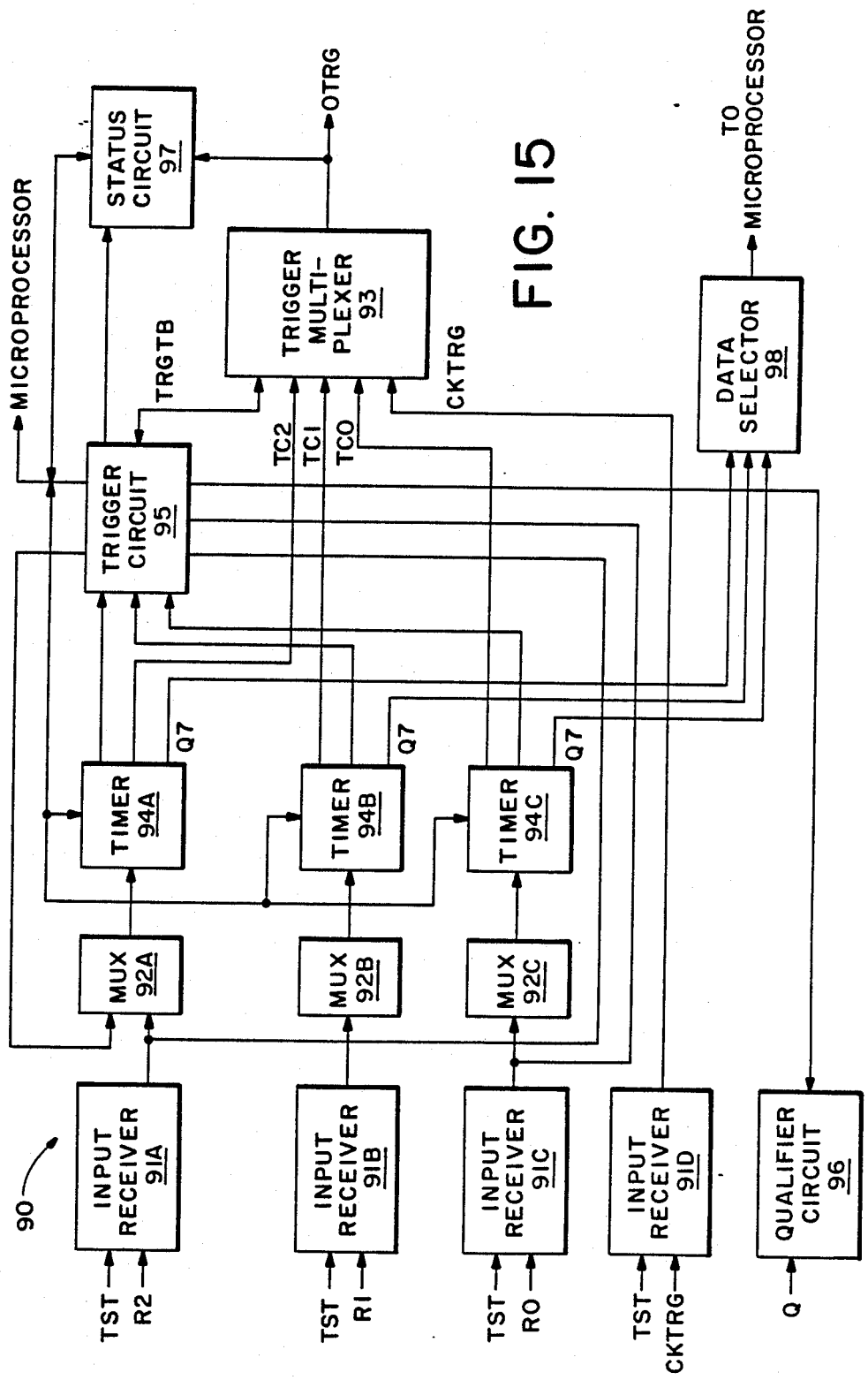
FIG. 15 is a block diagram of the state machine of FIG. 1.

State machine 90 appears in block diagram in FIG. 15. It receives the trigger inputs R0, R1, R2 and CKTRG, CKTRGB from recognizer 80. If the trigger conditions of the selected mode are met, it generates trigger signal OTRG to mainframe 30. The state machine comprises a number of timer circuits, multiplexers, and selector circuits which are operable in the time-qualified triggering modes. The circuit portions of the state machine are each discussed in detail below.

1. Input Receivers 91

Referring to FIG. 15, output signals from high speed output 87 and CKTRG enter state machine 80 through input receivers 91A through 91D. The inputs are then passed to following timing multiplexers 92A through 92C for the trigger inputs R0, R1, R2 and to trigger multiplexer 93 for CKTRGB from clocked mode 89.

2. Timing Multiplexers 92

Timing multiplexers 92A through 92C receive the output signals from multiplexers 91A through 91C, respectively, and multiplex them to timers 94A through 94C. In this circuit, only timer 94A is truly multiplexed, with 94B and 94C installed solely to match the signal delay through 94A. The other signal inputs to timer 94A originate at trigger circuit 95 and are used in several of the time-based triggering modes.

3. Trigger Multiplexer 93

Trigger multiplexer 93 appears at the right of FIG. 15. It is controlled by microprocessor 160 to select which of its inputs will be the trigger display signal, OTRG. Its inputs include CKTRGB, which is routed through state machine 80 directly to the trigger, multiplexer terminal counts TC2, TC1, TC0 of timers 94A through 94C, and the TRGTB line from triggering circuit 95. The terminal counts are enabled here only for test purposes, being normally used in conjunction with triggering circuit 95. TRGTB is the triggering signal for time-based triggering modes.

4. Timers 94

Timers 94A through 94C are enabled by the presence of input signals that originate at timing multiplexer 92A through C. These signals are the trigger inputs or, in the case of timer 94A, inputs from triggering circuit 95. If the signals are present for a predetermined time, an output signal TC is generated by the timer.

Figure 16A:
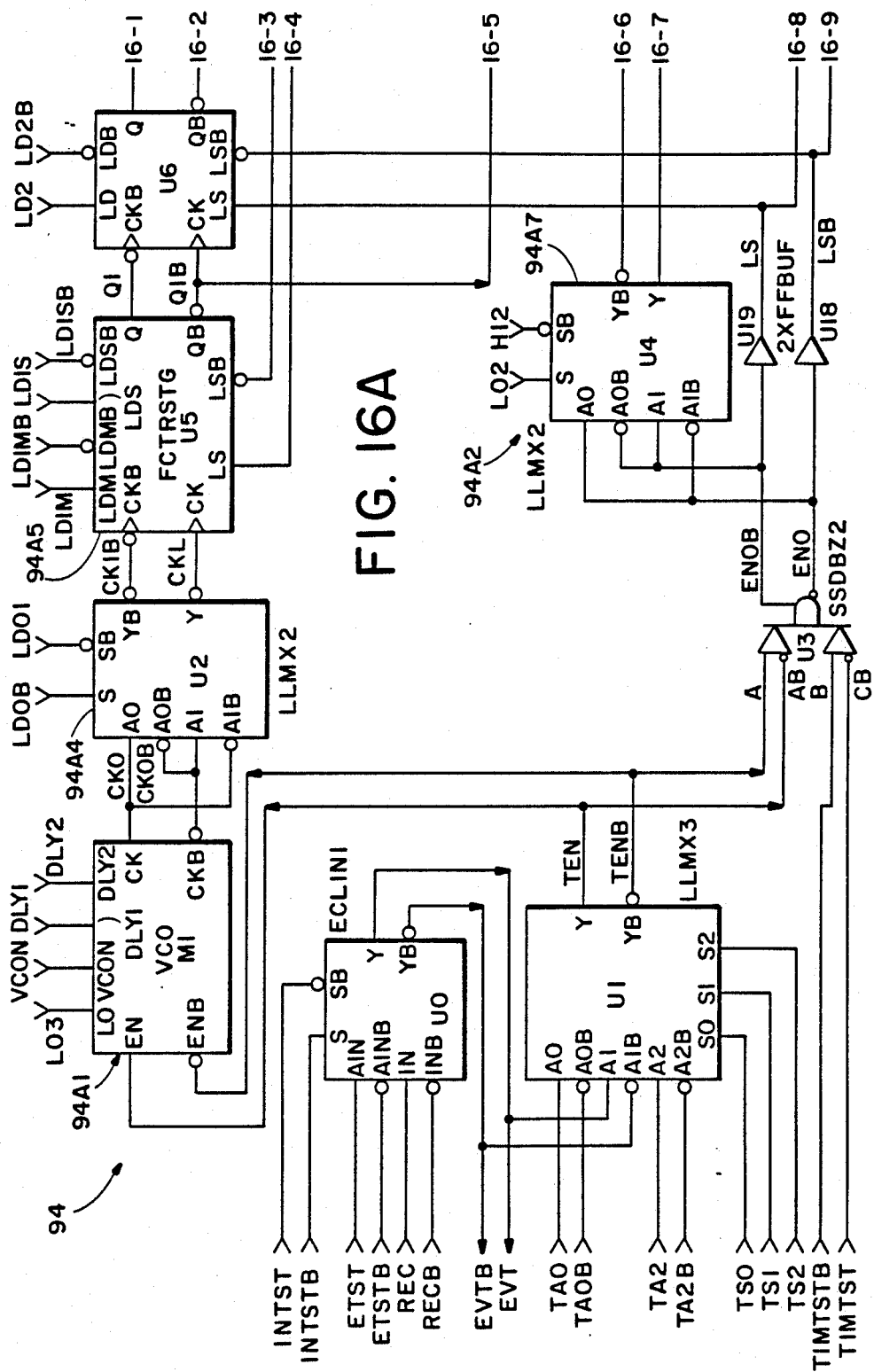
FIGS. 16a and 16b are a schematic diagram of the timing circuit block of the state machine.
Figure 16B:
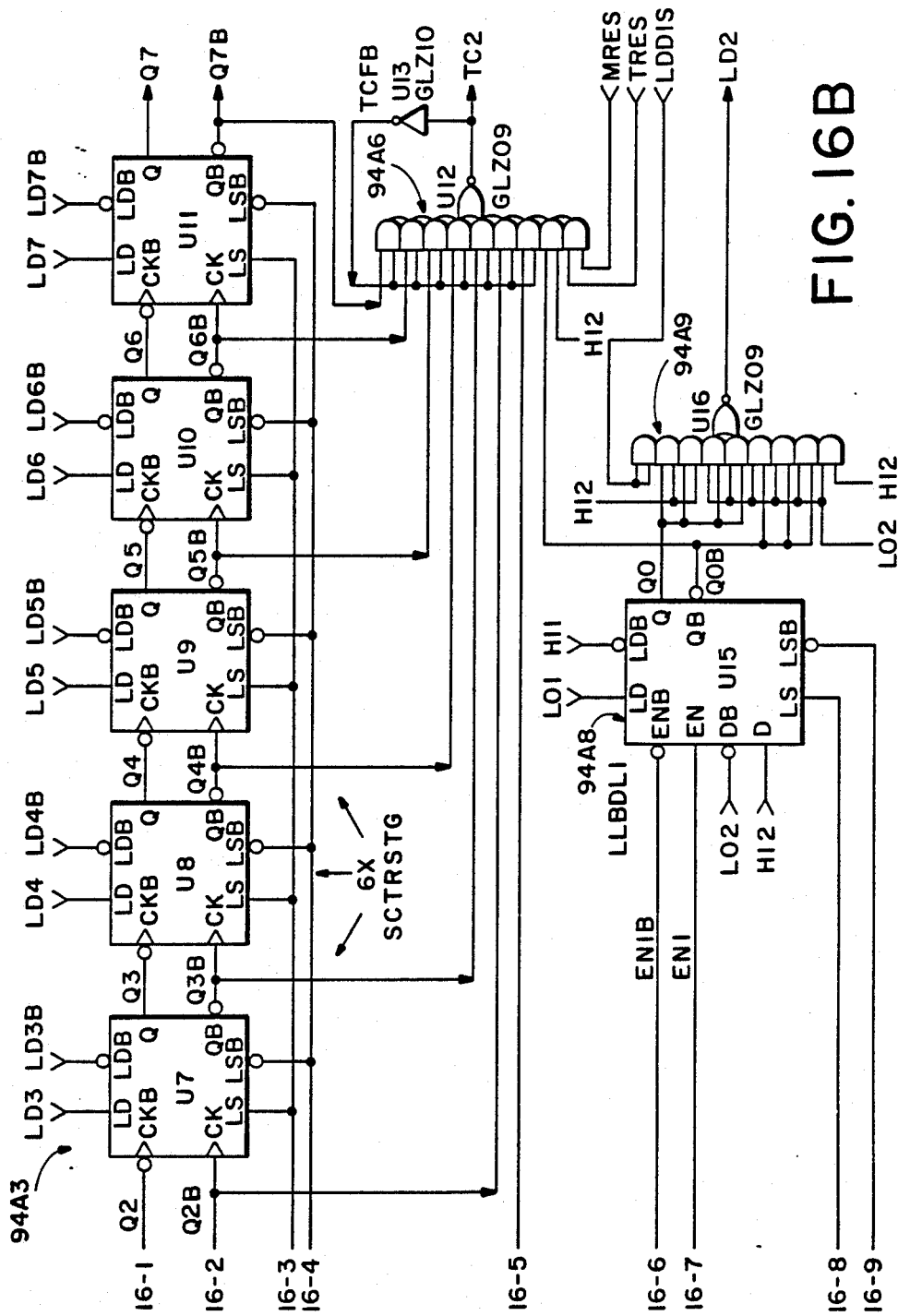

The design of the timers is best seen in FIG. 16. Input signals from timing multiplexer 92A are routed to a voltage control oscillator (VCO) 94A1 and to delay circuitry 94A2. The presence of the signals activates VCO 94A1 to provide a clock signal to ripple counter 94A3 through multiplexer 94A4. Data inputs to the ripple counter from microprocessor 160 store a predetermined binary number representing a chosen time. As the clock signal causes the counter to count down, the QB outputs of each counter eventually go low. When all QB outputs are low, they generate low signals in selector 94A6, which cause a high signal on line TC2. Selector 94A6 also has a master reset signal MRES as an input to disable the selector in certain trigger modes.

Input signals are routed to the delay circuitry 94A2 at the bottom of FIG. 16 to perform two functions. They generate a load signal LD2 that has the inverse value of the trigger input signals that enable the counter 94A3, such that LD2 is high when the trigger inputs are absent and LD is low when the inputs are present. They also actuate the load strobe inputs of ripple counter 94A3 to reload the initial value present on data lines into the counter. For example, if the counter is set for 73 nanoseconds and times to 5 nanoseconds before the enabling trigger input signals disappear, LD will go high and the strobe inputs will reload 73. Latches 94A7, 94A8 and selector circuitry 94A9 are included in delay circuitry 94A2 to match the delay of multiplexers 94A4 and 94A5 in the ripple counter.

VCO 94A1 is calibrated by feedback to microprocessor 160 through outputs Q7 and Q7B at the low end of ripple counter 94A3. Referring back to FIG. 15, Q7 is routed to the microprocessor through data selector circuit 98.

5. Qualifier Circuit 96

The qualifier circuit in state machine 80 is identical to that in word recognizer 80. The qualifying output QB is routed to triggering circuit 95, as shown in FIG. 15, to qualify the time-qualified modes. The trigger signal of trigger multiplexer 93 is routed back to the qualifying circuit to reset Q after a trigger signal has occurred. Other reset inputs from trigger circuit 95 (lines omitted) also reset Q after a reset event occurs.

6. Triggering Circuit 95

Figure 17A:
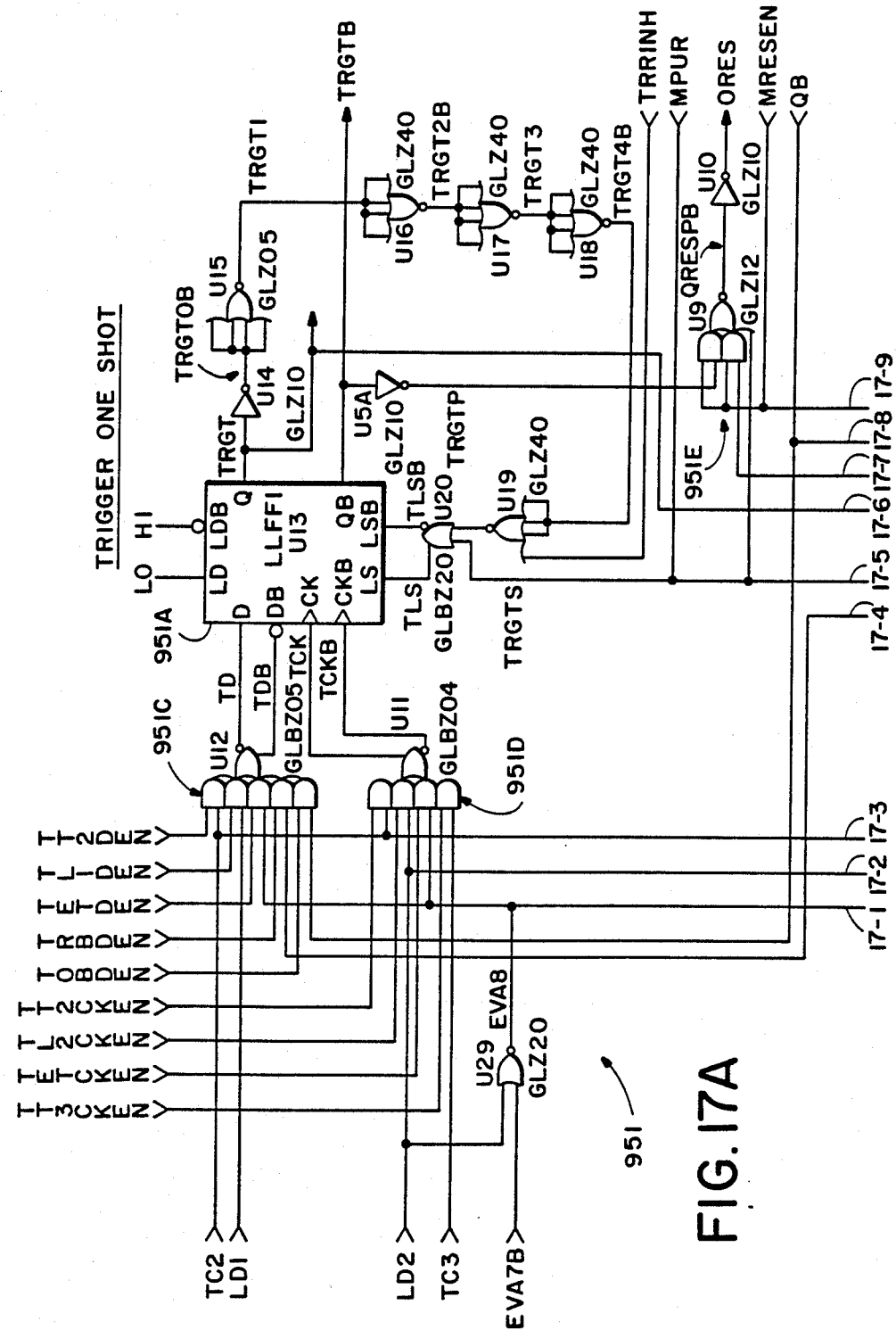
FIGS. 17a and 17b are a schematic diagram of a portion of the trigger circuit block.
Figure 17B:
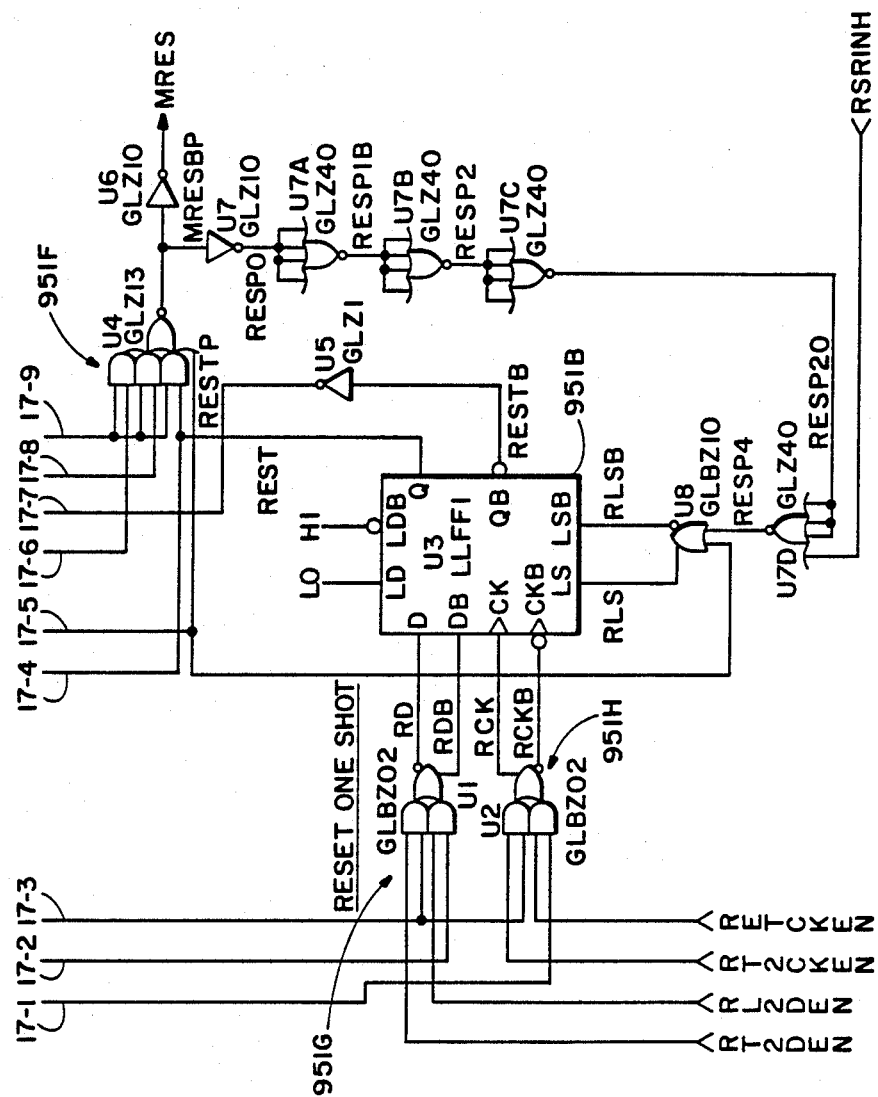
Figure 18:
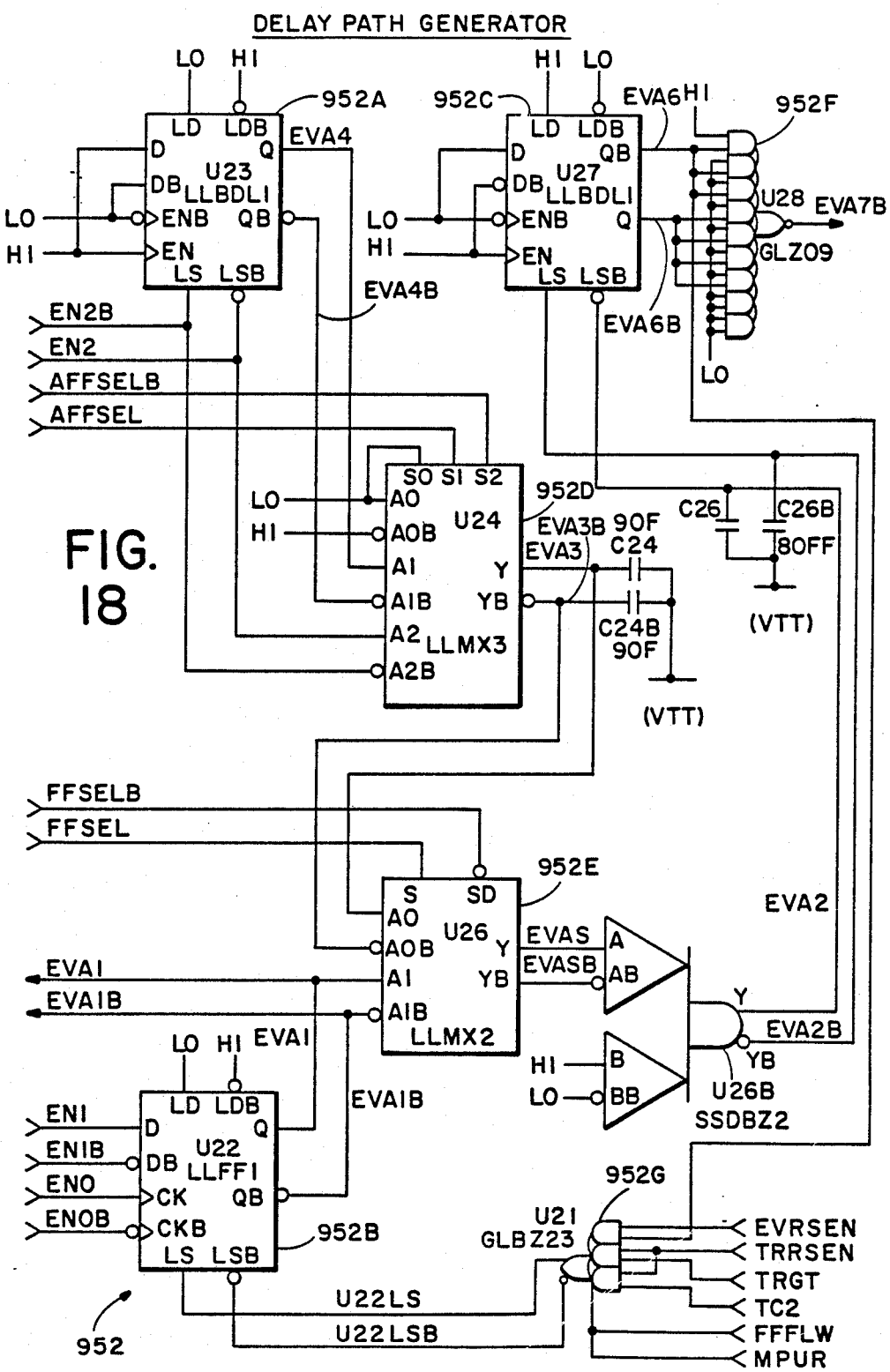
FIG. 18 is schematic diagram of a second portion of the trigger circuit block.
Figure 19:
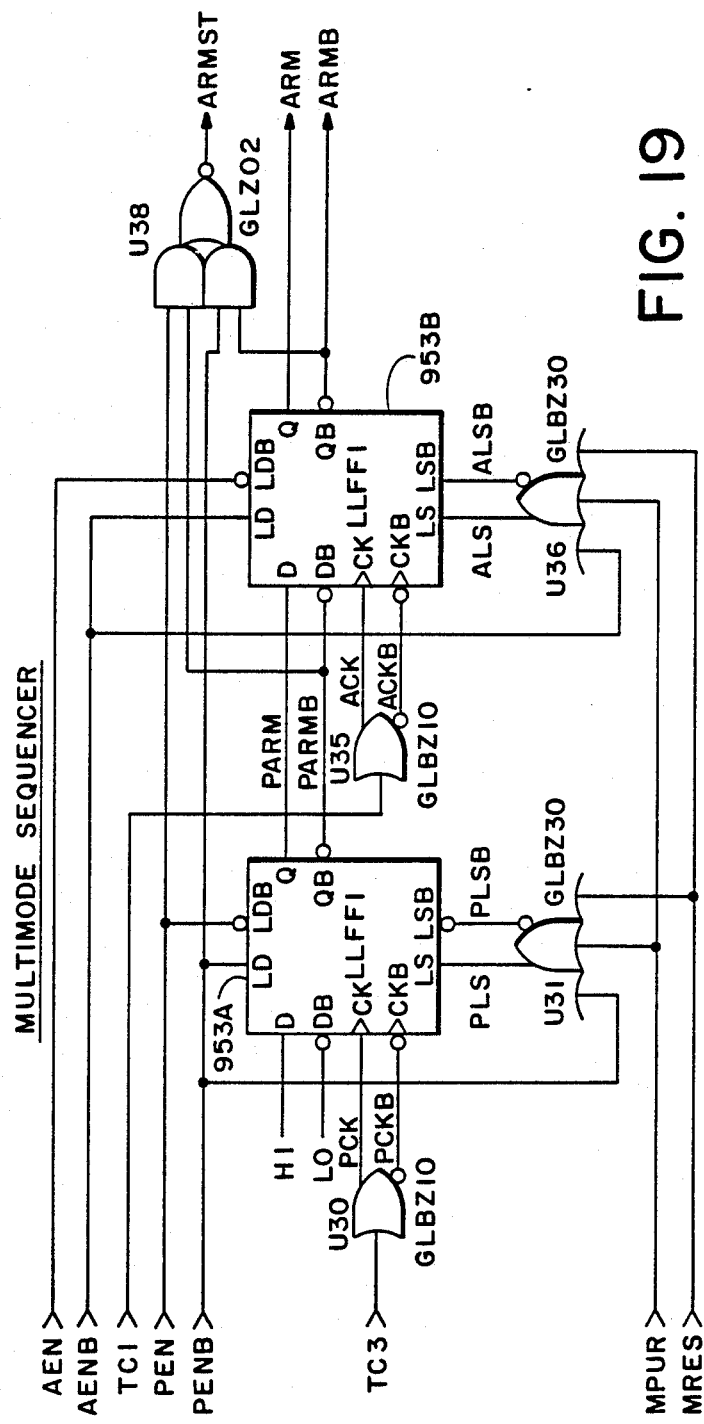
FIG. 19 is a schematic diagram of a third portion of the trigger circuit block.

Triggering circuit 95 generates the trigger signal TRGTB for triggering in the time-based modes. The circuit 95 comprises three subblocks 951 through 953 that together control the trigger modes. FIG. 17 shows output circuitry 951. FIG. 18 shows delay path generator 952. FIG. 19 shows multimode sequencer 953.

a. Output Circuitry 951

Referring to FIG. 17, the output circuitry generates TRGTB in response to inputs from timers 94A through C, a qualifying signal Q and control signals from microprocessor 160. Those control signals determine what inputs will cause a trigger to occur and what inputs will cause a reset, if any, to result. The circuit is constructed around a trigger latch 951A and a reset latch 951B. Both are one-shot, such that after each clocks an output, the latch is reset to remove its output signal.

The data inputs to the trigger latch 951A are selected through a selector 951C and the clock is selected through a selector 951D, both under microprocessor control. The trigger signal TRGT that is generated is directed through selector 951E to generate a qualifier reset QRES and through selector 951F to generate a timer disable MRES.

Reset latch 951B is similar in configuration to trigger latch 951A. Selector 951G selects data inputs to the latch and selector 951H selects a clock input, both under microprocessor control. The reset output signal is routed back to the data inputs of trigger latch 951A, to disable the latch if the reset occurs first.

b. Delay Path Generator 952

The delay path generator is designed to mimic the delay of timers 94A through 94C. Referring to FIG. 18, it comprises latches 952A, flip-flop 952B, latch 952C, multiplexers 952D, E, and gates 952F and G. Microprocessor 160 controls the operation of these components as required by the selected mode. The EVA7B output of the delay path generator 952 is sent to output circuitry 951 as a clock for the trigger and reset latches.

c. Multimode Sequencer 953

The multimode sequencer is used in triggering modes that require prearming and arming events, such as the consecutive and exception modes to be discussed. It comprises a prearm flip-flop 953A and an arm flip-flop 953B that have load inputs and a load strobe as well as data inputs and a clock input. By microprocessor control of the load strobes and the load inputs, prearm and arm signals can be generated in response to input signals. A selector 953C is connected to the arm signal output to detect an arming event and relay it to status circuit 97.

7. Status Circuit 97

The status circuit within the state machine is identical to that shown and described in word recognizer 80. It monitors the trigger event in trigger multiplexer 93 and detects the arm event in multimode sequencer 953. Its outputs ARM0Q and TR0Q are routed to front panel 230 on polling by microprocessor 160 to show that the event has occurred.

Operation of the Triggering Modes

Operation of trigger 10 is best understood by considering the operation of each of its triggering modes. Mode operation comprises microprocessor-based commands for setting up the mode and the resulting circuit response to the analog input signals.

Clock-Qualified Triggering

A flowchart of microprocessor operation in the clock-based modes is shown in FIG. 20. The operator initially selects at front panel 230 the triggering mode, the threshold logic levels, the predetermined combination or combinations and the status of the qualifier signal Q. The microprocessor in response sends data and control signals to the different circuits within trigger 10. It causes threshold voltage generator 150 to generate the predetermined threshold voltages for comparison with the analog input voltages and loads recognition blocks 83A through 83C with predetermined combinations. Clock circuit 84 is also configured to select the predetermined clock channel and rising or falling edge.

At mode control 86, the microprocessor selects the appropriate combination of recognition signals and routes them to clocked mode 89 along with the clock signal from clock circuit 84. Within clocked mode 89, microprocessor 160 selects the type of qualifying signal desired and the inputs to trigger latch 892A. The microprocessor also periodically polls status circuit 893 for arm or trigger events.

State machine 80 acts as conduit for the trigger signal in the clock-based triggering modes. It is disabled except for trigger multiplexer 93, which selects CKTRG for the trigger display signal that is transmitted to the display 40.

Clocked-Single Mode

In this triggering mode, recognizer block 83A is configured to detect a predetermined combination as the trigger event. For example:
While Q is high,

|            | 8 | 7 | 6 | 5 | 4 | 3 | 2 | 1 |     |
|------------|---|---|---|---|---|---|---|---|-----|
| Trigger on | H | H | / | L | T | X | L | H | (3) |

This combination (3) appears at recognizer block 83A, with channel six selected as the clock. If the combination appears on the inputs, the recognition signal of block 83A goes high and is routed to mode control 86 and by microprocessor command onto clocked mode 89. During the same time, channel six is monitored for a clock signal at clock circuit 85, and when it occurs, it also is routed to clocked mode 89.

Referring to FIG. 13, the recognition signal appears at R2 as a data input to trigger latch 892A. The clock input from clock circuit 85 appears as the clock to the trigger latch. When the recognition signal is present on a positive clock edge on CK, the trigger latch generates clock trigger signal CKTRG. CKTRG is routed to state machine 80 as the trigger display signal OTRG through trigger multiplexer 93.

Figure 21:
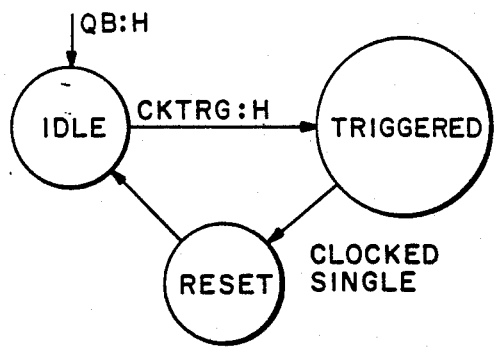
FIG. 21 is a state diagram of the clock-single triggering mode.

The operation of this trigger mode is shown by state diagram in FIG. 21. Trigger 10 is at an idle state until trigger latch 892A generates CKTRG. The trigger signal occurs and initiates a reset of the trigger.

Clocked-Nested Mode

In this mode the trigger occurs on the second of two events, where each event is a predetermined combination evaluated on a clock edge derived from one of the input channels. Another predetermined combination forms a reset event. For example:

| While Qualifier = Low |   |   |   |   |   |   |   |     |
|---|---|---|---|---|---|---|---|-----|
| Look For |  |  |  |  |  |  |  |     |
| 8 | 7 | 6 | 5 | 4 | 3 | 2 | 1 | (4) |
| X | L | L | H | H | L | / | H |     |
| Then |  |  |  |  |  |  |  |     |
| Trigger If |  |  |  |  |  |  |  |     |
| 8 | 7 | 6 | 5 | 4 | 3 | 2 | 1 | (5) |
| H | X | L | L | H | H | / | H |     |
| Reset If |  |  |  |  |  |  |  |     |
| 8 | 7 | 6 | 5 | 4 | 3 | 2 | 1 | (6) |
| L | L | L | L | L | L | / | L |     |
| Else Wait |  |  |  |  |  |  |  |     |

In the nested mode, all recognizer blocks are used. The block 83A detects the arming event and generates a recognition signal which is routed through mode control 86 to R0, R0B of clock mode 89. R0 is the data input to arm latch 892C, as shown in FIG. 13. The qualifier Q is the other input of the arm latch. With the clock signal appearing simultaneously on the clock input to the latch, latch 892C generates an arm signal.

This arm signal is directed to the data inputs of trigger latch 892A and the data inputs of reset latch 892B.

With the arm signal present, the data inputs of trigger latch 892A goes high when a trigger event (5) appears contemporaneously on R2 from block 83C. With both present, a clock pulse on channel two will generate a trigger signal from the trigger latch.

The nested mode also specifies a predetermined combination (6) for resetting the mode if that event appears before the triggering event. Referring again to FIG. 13, with the reset latch 892B armed by the arming signal of latch 892C, the reset occurs if combination (6) is detected on recognizer 83B and routed on R1 to the reset latch. If a clock pulse on channel two is present contemporaneously with R1 and the arming signal, latch 892B generates a reset signal CKRES. This signal also disables trigger latch 892A.

Figure 22:
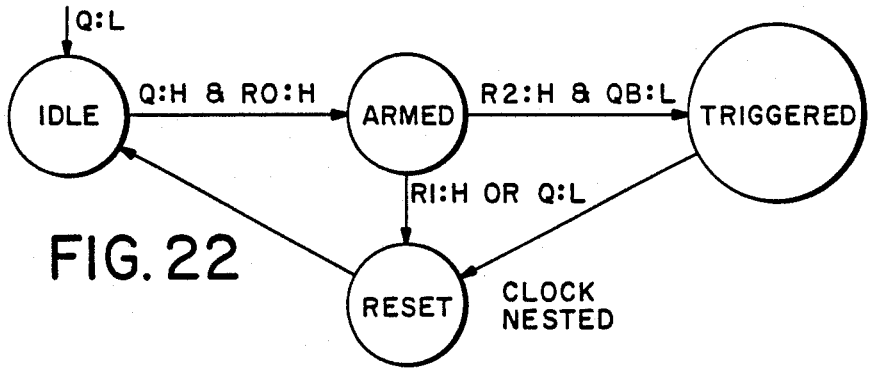
FIG. 22 is a state diagram of the clocked-nested triggering mode.

The operation of this mode is shown in the state diagram of FIG. 22. The trigger is in the idle state with the qualifier signal low. When the arming event appears, the trigger is armed. It may then trigger if the trigger event is detected or it may reset if the reset event is detected. After a trigger signal is generated, the trigger is reset.

Clocked-Consecutive Mode

In this mode, the trigger occurs after a predetermined arming event combination is detected and is followed immediately by one of two predetermined combinations that form a triggering event. Any other combination following the arming event is a reset event. For example:

| While Qualifier = Low | | | | | | | | | |
|---|---|---|---|---|---|---|---|---|---|
| Look For | | | | | | | | | |
| 8 | 7 | 6 | 5 | 4 | 3 | 2 | 1 | | (7) |
| H | H | / | H | L | L | H | H | | |
| Then If | | | | | | | | | |
| | | | | | No Change | | Wait | | |
| 8 | 7 | 6 | 5 | 4 | 3 | 2 | 1 | | (8) |
| H | L | / | H | L | H | H | H | Trigger | |
| or | | | | | | | | | |
| 8 | 7 | 6 | 5 | 4 | 3 | 2 | 1 | | (9) |
| H | L | / | L | H | H | H | H | Trigger | |
| Otherwise | | | | | | | | Reset | |

In this mode, mode control 86 selects recognizer block 83C to detect the arming event and route its recognition signal to R0 and R1. Blocks 83A and 83B each detect one of the two combinations that are the triggering event and route their recognition signals to R2. R0 then provides the input to arm latch 892C along with the qualifier signal Q. At a clock pulse on channel six, the arm signal occurs and is routed to reset latch 892B and trigger latch 892A. If a triggering event appears on R2 contemporaneously with a following clock input on channel six, a trigger signal occurs. On the other hand, if an armed false event occurs on R1 contemporaneously with a clock input on channel six, the reset latch generates a reset signal, which disables trigger latch 892A.

Figure 23:
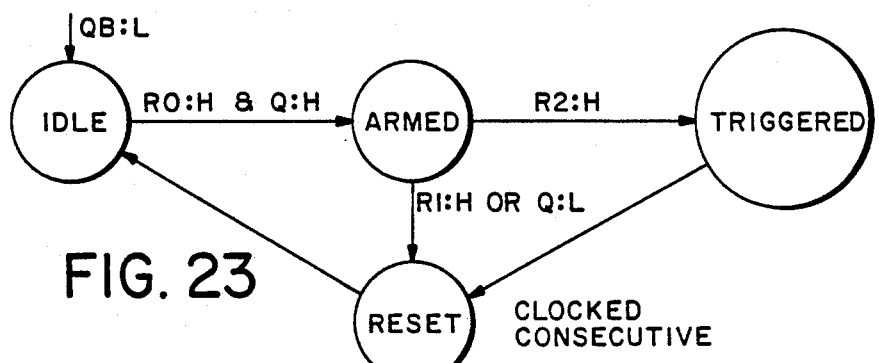
FIG. 23 is a state diagram of clocked-consecutive triggering mode.

The mode of operation is diagrammed in FIG. 23. Trigger 10 is in the idle state until the arming event (7) is detected on recognizer C. With the trigger armed, it can either trigger or reset depending on which event next follows. After either occurs, the trigger is reset.

Clocked-Exception Mode

This mode is similar in operation to the consecutive mode with the input to R2 inverted. The trigger occurs in this mode if, after the occurrence of a first combination forming an arming event, two predetermined combinations forming a reset event are absent immediately after the first combination disappears. If either of those two predetermined combinations is present, a reset occurs. Otherwise, any other combination forms a trigger event. For example:

| While Qualifier = High | | | | | | | | | |
|---|---|---|---|---|---|---|---|---|---|
| Look For | | | | | | | | | |
| 8 | 7 | 6 | 5 | 4 | 3 | 2 | 1 | | (10) |
| H. | / | L | L | H | H | H | H | | |
| And If | | | | | | | | | |
| | | | | | No Change | | Wait | | |
| 8 | 7 | 6 | 5 | 4 | 3 | 2 | 1 | | (11) |
| H | / | L | H | L | H | H | H | Reset | |
| or | | | | | | | | | |
| 8 | 7 | 6 | 5 | 4 | 3 | 2 | 1 | | (12) |
| H | / | H | L | H | H | H | H | Reset | |
| Otherwise | | | | | | | | Trigger | |

Figure 24:
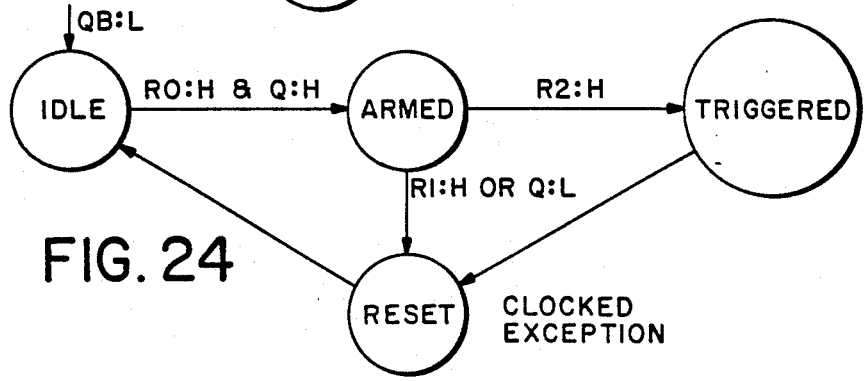
FIG. 24 is a state diagram of clocked-exception triggering mode.

Here, the arming combination 10 is routed to Rφ and combinations (11, 12) are ORed and routed to R1. A combination other than (11, 12) is routed to R2. If one of the two second predetermined combinations appears contemporaneously with the clock input on channel seven, reset latch 892B generates a reset signal. On the other hand, if any other combination appears on R2 beforehand contemporaneously with a clock input on channel seven, trigger latch 892A generates a clock trigger signal. The state diagram of FIG. 24 shows the sequence of operation of this mode.

Time-Based Trigger Modes

A flowchart of microprocessor operation in the time-based modes is shown in FIG. 25. As in clock based modes, the operator initially selects at front panel 230 the trigger mode, the threshold logic levels, the predetermined combination or combinations, and the status of the qualifier signal Q. In addition, the operator selects the durations for the predetermined combinations. In response to these inputs, the microprocessor sends data and control signals to the different circuits within trigger 10. It causes threshold voltage generator 150 to generate the predetermined threshold voltages for comparison with the analog input voltages. It commands high speed input 81 to select the real signal inputs and loads register blocks 83A through 83C with the predetermined combinations. It also configures state transition circuit 83 and clock circuit 84. At mode control 86, the microprocessor selects for a selected triggering mode the appropriate combination of recognition signals, state transition signals, and clock signals and routes them to high speed output 87. It also sends the appropriate signals to timers 94A through 94C for the predetermined durations and controls the operation of the data selectors and multiplexers within state machine 80.

The operation of each time-based trigger mode is shown by state diagrams in FIGS. 26 through 33. In these modes TRTGB from trigger circuit 95 is the trigger display signal.

Timed-Single Mode

In the timed-single mode, the trigger detects the occurrence of a predetermined combination for a predetermined time as the triggering event. For example:

```
While Qualifier = High
  Trigger on
     8  7  6  5  4  3  2  1                    (13)
     H  T  T  L  T  X  L  H  Lasting >10 ns
```

Recognizer block 83A detects the predetermined combination (13) and sends its recognition signal through mode 86 to inputs R2, R2B at input receiver 91A, shown in FIGS. 15, 16. The microprocessor selects these inputs in timing multiplexer 92A to enable timer 94A. The timer, previously loaded by microprocessor 160 with a predetermined time represented by a binary number, starts counting when the inputs are present on the enable lines. If the counter counts out, line TC2 goes high. Referring to FIG. 17, TC2 is the clock input on selector 951D to the trigger latch 951A. The data input to latch 951A is selected by selector 951C to be QB, with all other lines disabled. If QB is low, indicating the qualifier is present, the data input is high and a trigger signal occurs on the appearance of TC2. TRTGB is routed to trigger multiplexer 93 and TRGT, its complement, resets trigger latch 951A and reset latch 951B.

If the recognition signals disappear at the enable inputs to timer 94A, the timer is reloaded automatically.

Figure 26:
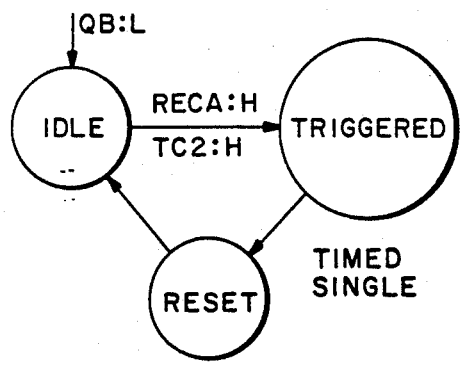
FIG. 26 is a state diagram of the timed-single triggering mode.
Figure 27:
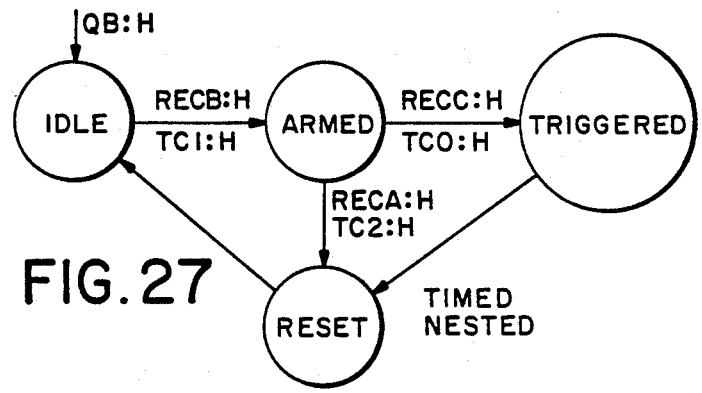
FIG. 27 is a state diagram of the timed-nested triggering mode.

Referring to FIG. 26, timer 94A waits continuously in its idle state until a recognition signal of sufficient duration is detected.

Timed-Nested Mode

In this mode, the trigger occurs in the second of two events, where event is a predetermined combination having a predetermined duration. A combination representing a reset event may also be specified. For example:

```
While Qualifier = High,
  Look For
    8  7  6  5  4  3  2  1                       (14)
    L  L  X  H  H  L  L  H  Lasting >20 ns
  Then
    Trigger If
    8  7  6  5  4  3  2  1                       (15)
    H  X  X  L  H  H  L  H  Lasting >30 ns
    Reset If
    8  7  6  5  4  3  2  1                       (16)
    L  L  X  L  L  L  L  L  Lasting >50 ns
  Else Wait
```

Each of the recognizer blocks is used. Timer 94B is the arm timer and receives inputs from recognizer block 83B through R1. Timer 94A is a reset timer and receives its inputs from recognizer block 83C through R2. Timer 94C is a trigger timer and receives its inputs from recognizer block 83A through R0.

When the arm event (14) appears on R1, it enables timer 94B, shown in FIG. 15. The timer's output, TC1, becomes a clock input to arm latch 953B, shown in FIG. 19. The data inputs to the latch are set high by microprocessor signals PENB and PEN to cause the preceding latch 953A to strobe a high value onto the data inputs of latch 953B. Latch 953B then generates ARM and ARMB signals when clocked by TC1 that ar routed to timers 94A and 94C, as shown in FIG. 15. ARMB clears the MRES signals from these timers, allowing them to time if recognition signals on R2, R0 appear at their inputs.

If the trigger combination (15) appears at the enable inputs to timer 94C for sufficient duration, the timer times out and TC0 goes high. Referring to FIG. 17, TC0 forms a clock input to trigger latch 951A through selector 951D. The data inputs to the trigger latch are an enable signal from the microprocessor and the qualifier signal QB. With the qualifier present, the trigger latch will generate a trigger signal on the appearance of TC0.

If the reset combination (16) is present on timer 94A and times out before the trigger timer does, TC2 goes high. TC2 in this mode is the clock for reset latch 951B. The data input to the reset latch is set high by microprocessor control. The reset signal generated by latch 951B causes MRES to go high to reset latch 953B, as shown in FIG. 19. The reset signal is also routed to trigger latch 951A to disable the data input, thereby preventing a trigger signal from occurring after a reset signal.

Timed Consecutive Mode

In the timed consecutive mode, a trigger occurs after a first predetermined combination selected as an arming event is detected and followed within a window of time by one of two predetermined combinations forming a trigger event. If those combinations do not occur within that window, the trigger is reset. For example:

```
While Qualifier = Low
  Look For
    8  7  6  5  4  3  2  1                       (17)
    H  H  H  H  L  L  H  H  Lasting >50 ns
    And then disappearing for 70 nanoseconds;
  Then during a 40 nanosecond window:
    If
    8  7  6  5  4  3  2  1                       (18)
    H  L  L  H  L  H  H  H  Trigger
    or
    8  7  6  5  4  3  2  1                       (19)
    H  L  H  L  H  H  H  H  Trigger
    Otherwise        Reset
```

In this mode, timer 94C is the prearm timer, timer 94B is the arm timer; and timer 94A is the time window timer. For prearming, recognizer block 83C detects combination (17) and routes its recognition signal to R0, R0B of timer 94C. If it is present for the predetermined time, the timer successfully times out and TC0 goes high. Referring to FIG. 19, TC0 then clocks a high signal on latch 953A. The trigger is now prearmed. The second step in this mode is the disappearance of the first combination for a predetermined time. This is measured on arm timer 94B. The inputs to that timer, R1, R1B, are the complement of the inputs to R0, R0B. Once the recognition signal on recognizer block 83C disappears, R1 goes high and timer 94B begins to time. If it successfully times out, TC1 goes high, clocking through latch 953B the high signal from latch 953A to generate ARM, ARMB.

Referring to FIG. 15, ARM, ARMB are fed back to the inputs of timing multiplexer 92A and selected by microprocessor control to be the enabling inputs to timer 94A. They start the time window. While it is active, inputs R2, R2B are routed to inputs EN2, EN2B of trigger circuit 95, which appear in the delay path generator of FIG. 18. The microprocessor enables multiplexer 952D to accept these input signals and route them through multiplexer 952E to the output gate 952F. The output that results is EVA7B, which is the complement of the enable inputs. Thus, if combinations (18, 19) are present during the time window, EVA7B is low.

Referring to FIG. 17, EVA7B is NORed with LD2 to form EVA8 as a clock input to trigger latch 951A. Assuming that ARM is present, LD2 is low and EVA8 high to clock the trigger latch. TC2, which forms the data input to the trigger latch, is low if the window is present. Thus, the data input to the trigger latch is high, and a trigger signal is generated by trigger latch 951A.

If the time window disappears before either of combinations (18, 19) appear to generate the clock input to the trigger latch, TC2 will be high and the data input to the trigger latch will be low so that no trigger signal can be generated. TC2 will also clock a high value into reset latch 951D, causing a reset signal to be generated that resets latches 953A, 953B and disables the trigger latch 951A.

Figure 28:
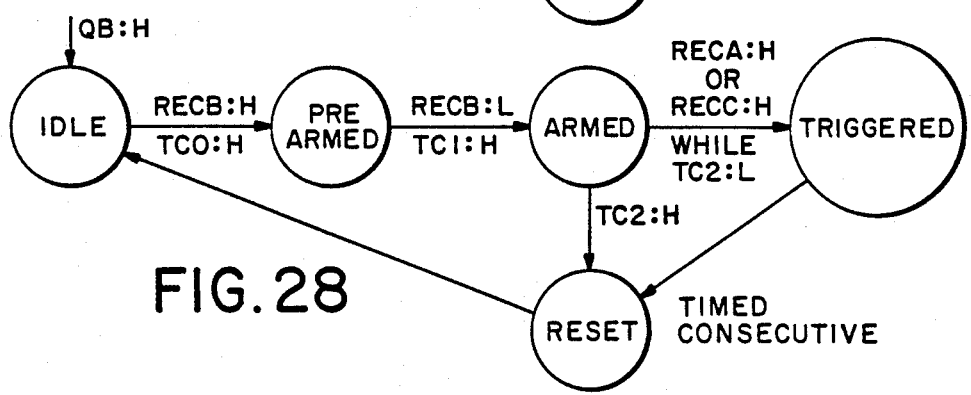
FIG. 28 is a state diagram of the timed-consecutive triggering mode.

Referring to FIG. 28, a state diagram of the triggering mode is shown. From the idle stage, the trigger moves to a prearm stage, an arm stage, and then either triggers or resets, depending upon the combinations that occur.

Timed-Exception Mode

In the timed-exception mode, a trigger occurs after a first predetermined combination forming an arming event is detected followed within a window of time by the absence of two predetermined combinations. Otherwise, the trigger resets if either combination occurs. For example:

| While Qualifier = High | | | | | | | | |
|---|---|---|---|---|---|---|---|---|
| Look For | | | | | | | | |
| 8 | 7 | 6 | 5 | 4 | 3 | 2 | 1 | (20) |
| H | H | L | L | H | H | H | H | Lasting >10 ns |
| And then disappearing for 90 nanoseconds; | | | | | | | | |
| Then during a 30 nanosecond window: | | | | | | | | |
| If | | | | | | | | |
| 8 | 7 | 6 | 5 | 4 | 3 | 2 | 1 | (21) |
| H | L | L | H | L | H | H | H | Reset |
| or | | | | | | | | |
| 8 | 7 | 6 | 5 | 4 | 3 | 2 | 1 | (22) |
| H | L | H | L | H | H | H | H | Reset |
| Otherwise | | | | | | | Trigger | |

Operation in this mode is similar to the consecutive mode. Here, however, EVA8 (FIG. 17) is used as a clock input to reset latch 951B rather than a clock input to trigger latch 951A. This is accomplished by microprocessor control. TC2 of timer 94A becomes the data input to the reset latch through selector 951G and the clock input to trigger latch 951A through selector 951C. The data input to the trigger latch is the qualifier signal QB.

Figure 29:
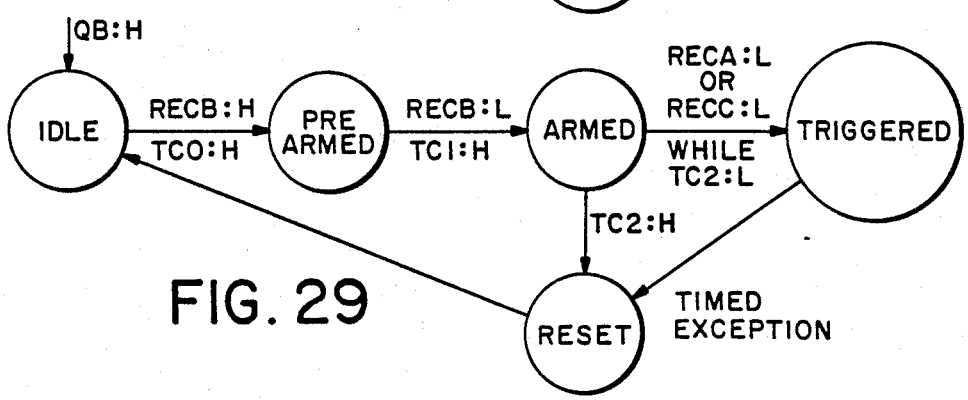
FIG. 29 is a state diagram of the timed-exception triggering mode.

If the predetermined combinations are absent, TC2 will cause trigger latch 951A to generate a trigger signal. If the predetermined combinations are present, EVA8 will cause reset latch 951B to generate a reset signal, which will then disable the trigger latch, as before. Referring to FIG. 29, a state diagram of this triggering mode is shown.

Setup-Time Violation Mode

The setup-time violation detects as the trigger event a transition logic level on one or more input lines present within a predetermined time prior to a clock signal. In this mode, input signals can be checked to see if they are stable for a sufficient time before a clock edge. For example:

| While Qualifier = High | | | | | | | | |
|---|---|---|---|---|---|---|---|---|
| Trigger On | | | | | | | | |
| 8 | 7 | 6 | 5 | 4 | 3 | 2 | 1 | (23) |
| T | | | T | T | T | / | Setup <3 ns | |
| While: | | | | | | | | |
| 8 | 7 | 6 | 5 | 4 | 3 | 2 | 1 | (24) |
| H | | X | X | | | | | |

Referring to FIG. 15, signal STB from state transition circuit 83 is routed through mode control 86 to input R2 of timer 94A. The clock signal from clock circuit 84 is routed through mode control 86 to inputs R0, R0B and from there to inputs EN0, EN0B of triggering circuit 95.

With STB present, timer 94A will count down the predetermined time, indicating that the state transition is absent for the predetermined time. If it times out, TC2 goes high. Referring to FIG. 17, TC2 forms a data input to trigger latch 951C. If TC2 is high, then the data input to the trigger latch is low and no trigger signal is generated. If the timer has not timed out, TC2 will be low and a trigger signal will be generated.

The clock input to the trigger latch is produced through the delay path generator of FIG. 18. EN0, EN0B clock a high signal through latch 952B. This signal propagates the multiplexer 952E and latch 952C to produce a low output on EVA7B. As before, EVA7B is NORed with LD2, which is low if STB is present on the enable lines of timer 94A. The NOR gate output, EVA8, will then be high to generate a clock pulse to trigger latch 951A.

This mode also has a qualifier combination (24) on the input lines not used for transition logic levels. These lines produce a recognition signal on recognizer block 83C which is routed to inputs R1, R1B of timer 94B. The timer is not used in this mode, but the enable lines indicate the combination's presence or absence by a signal on LD1. If the inputs are present, LD1 is low. Referring to FIG. 17, LD1 qualifies the data input to trigger latch 951A along with TC2. If the combination is absent, LD1 is high, disabling the data input and thereby preventing the generation of a trigger signal.

Figure 30:
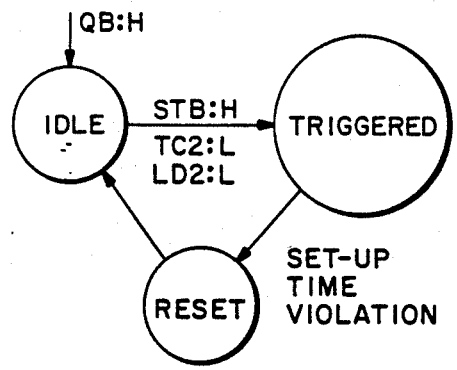
FIG. 30 is a state diagram of the setup time violation triggering mode.

A state diagram of the triggering mode is shown in FIG. 30.

Hold-Time Violation Mode

The hold-time violation detects as the trigger event input signals that are in the transition logic level within a predetermined time after a clock edge. For example:

| While Qualifier = High | | | | | | | | |
|---|---|---|---|---|---|---|---|---|
| Trigger on | | | | | | | | |
| 8 | 7 | 6 | 5 | 4 | 3 | 2 | 1 | (25) |
| | | | | T | T | T | / | Hold <5 ns |
| While: | | | | | | | | |
| 8 | 7 | 6 | 5 | 4 | 3 | 2 | 1 | (26) |
| X | X | L | H | | | | | |

Referring to FIG. 16, CK, CKB are input lines on R0, R0B and are routed to EN0, EN0B, as shown in FIG. 15 and 18. These inputs clock a high output on latch 952B which is routed out of trigger circuit 95 by way of lines EVA1 and EVA1B, rather than through multiplexer 952E. EVA1 and EVA1B are then multiplexed by timing multiplexer 92A as enabling inputs to timer 94A.

The transition signal input ST enters state machine 80 through R2, R2B and is routed to EN2, EN2B, also shown in FIG. 18. To match the delay of latch 952B, these input strobe a low output on latch 952A and route it through multiplexer 952D to produce an output signal EVA7B. Referring to FIG. 17, EVA7B is NORed with LD2 to form clock input EVA8 to trigger latch 951C.

If timer 94A times out, TC2 will go high to disable the data input to the trigger latch and no trigger signal will occur when EVA8 clocks the trigger latch. If timer 94A has not timed out, TC2 will be low and latch 951A will then generate a trigger signal upon a clock pulse.

Figure 31:
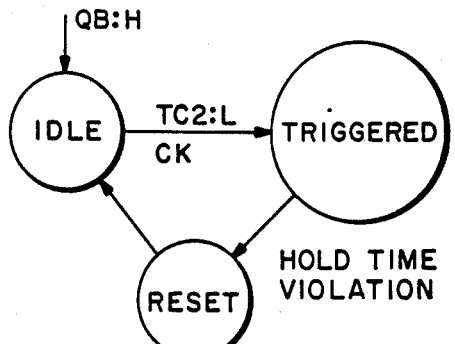
FIG. 31 is a state diagram of the hold-time violation triggering mode.

The hold time violation mode may also be qualified by a predetermined combination (26) on those lines not selected for monitoring of transition logic levels. This combination is detected by recognizer block 83B and routed to R1, R1B of timer 94B. If the combination is present, LD1 is low. If the combination disappears, LD1 goes high, disabling the data input and preventing the trigger latch from generating a trigger signal. Referring to FIG. 31, a state diagram of the triggering mode is shown.

Sliver Detection Mode

A sliver is defined as a pulse which exists for less than a predetermined reference time. In this mode, the sliver detected as a trigger event is an excursion from and return to a predetermined logic level on one input channel within a predetermined time while the other channels are configured as a qualifying event. For example:

| While Qualifier = High Trigger On | | | | | | | | | |
|---|---|---|---|---|---|---|---|---|---|
| 8 | 7 | 6 | 5 | 4 | 3 | 2 | 1 | | (27) |
| | | | | | ÷ | | | Sliver <2 ns | |
| While | | | | | | | | | |
| 8 | 7 | 6 | 5 | 4 | 3 | 2 | 1 | | (28) |
| H | H | L | X | X | | X | H | | |

The silver is detected as a clock pulse on clock circuit 84. The clock pulse is routed to R2, R2B to enable timer 94A. If the clock signal returns to its original value, the timer will stop counting. But, so long as the clock signal does not return, the timer counts down. The output TC2 forms the data input to trigger latch 951A.

The clock input to the trigger latch is line LD2 from timer 94A. This line goes high when the silver disappears. The trigger then occurs, if at all, after the silver has disappeared (the clock signal returning to its original level). If timer 94A has timed out at that point, TC2 will be high and will disable the data input to trigger latch 951A. If TC2 has not timed out at the time the signal disappears, TC2 will be low and a trigger signal will be generated on the occurrence of a high signal on LD2.

Figure 32:
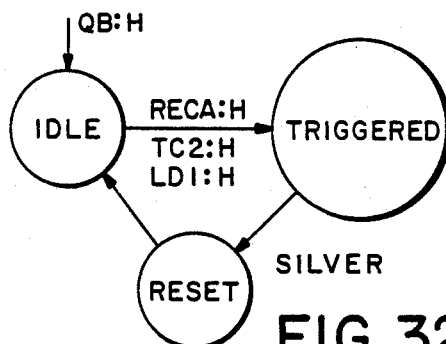
FIG. 32 is a state diagram of the sliver detection triggering mode.

The combination (28) selected as the qualifying event is routed from recognizer 83B to R1, R1B. It enables LD1, causing LD1 to be low so as not to affect the data input to trigger latch 951A. If the qualifying combination disappears, LD1 goes high and disables the data input, thereby preventing the latch from generating a trigger signal. FIG. 32 shows the state diagram of this triggering mode.

Transition Time Violation Mode

The trigger event is a transition detected on one channel and lasting for greater than a predetermined time. The other channels may be configured as a qualifying event. For example:

| While Qualifier = Low Trigger On | | | | | | | | | |
|---|---|---|---|---|---|---|---|---|---|
| 8 | 7 | 6 | 5 | 4 | 3 | 2 | 1 | | (29) |
| | | | | T | | | | Lasting >10 ns | |
| While | | | | | | | | | |
| 8 | 7 | 6 | 5 | 4 | 3 | 2 | 1 | | (30) |
| H | H | X | L | | H | X | L | | |

Transition signal ST from state transition circuit 83 is routed through mode control 86 to R2, R2B to enable timer 94A. TC2 from timer 94A forms the clock input for trigger latch 951A, with the data input provided by the qualifying signal QB. If the trigger event is present for the predetermined time, TC2 goes high to clock the data input into trigger latch 951A which generates a trigger signal if Q is present. If ST disappears before the timer times out, the timer is automatically reloaded and the mode begins again.

Figure 33:
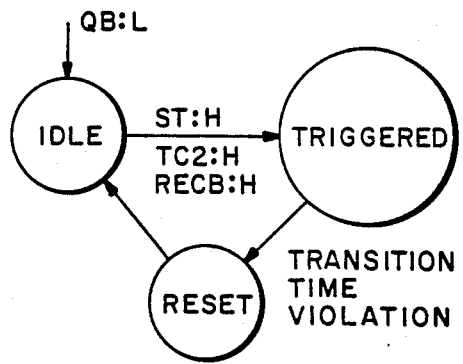
FIG. 33 is a state diagram of the transition time violation triggering mode.

The combination (30) selected as the qualifying event is detected by recognizer 83B and is routed through mode control 86 to inputs R1, R1B to enable timer 94B. The presence of a qualifying event causes LD1 to be low, enabling the data input to trigger latch 951A. If the qualifying event disappears, LD1 goes high to disable the data input and thereby prevent the latch from generating a trigger signal. The state diagram of this triggering mode is shown in FIG. 33.

Having illustrated and described the principles of the invention in a preferred embodiment, it should be apparent to those skilled in the art that the invention can be modified in arrangement and detail without departing from such principles. We claim all modifications coming within the spirit and scope of the following claims.

We claim:

1. A trigger circuit for detecting plural analog input signals along plural input signal lines and generating a trigger display signal in response thereto, comprising:

logic level discrimination means for receiving the input signals and respectively reconstructing each input signal into a high logic level representation thereof corresponding to a level of the input signal relative to a first threshold level, a low logic level representation thereof corresponding to a level of the input signal relative to a second threshold level which is below the first, and into a transitional logic level representation thereof corresponding to a level of the input signal relative to a level between the first and second threshold levels; and trigger event detection means for receiving the reconstructed input signals from the logic level discrimination means and detecting in the reconstructed input signals a triggering event comprising at least one predetermined combination of input signal logic level representations, the trigger event detection means including means for generating the trigger display signal in response to the detection of the triggering event.

2. The trigger circuit of claim 1 including means for selectably adjusting the first and second threshold levels.

3. The trigger circuit of claim 1 including threshold voltage generator means coupled to the logic level discrimination means for generating predetermined voltage levels as the first and second threshold levels.

4. The trigger circuit of claim 1 in which the detection means includes means for detecting a triggering event comprising a sequence of predetermined combinations of input signal logic level representations.

5. The trigger circuit of claim 1 in which the detection means includes means for detecting a triggering event comprising a consecutive sequence of a first predetermined combination of input signal logic level representations followed by one of two second predetermined combinations.

6. The trigger circuit of claim 1 in which the detection means includes means for detecting a triggering event comprising an exception sequence of a first predetermined combination of input signal logic level representations followed by the absence of a second predetermined combination.

7. The trigger circuit of claim 1 in which the detection means includes means for selecting one of the input signal lines as a clock signal line and means for detecting a clock pulse on the clock signal line, the trigger event detection means further including means for detecting a triggering event comprising at least one input signal on a line other than the clock signal line having a transition logic level representation occurring within a predetermined time before or after a detected clock pulse.

8. The trigger circuit of claim 1 in which the detection means includes means for detecting a triggering event comprising an input signal that moves from and returns to a predetermined logic level within a predetermined time.

9. The trigger circuit of claim 1 in which the detection means includes means for detecting a trigger event comprising an input signal having a transition logic level representation enduring longer than a predetermined time.

10. The trigger circuit of claim 1 in which the detection means comprises a word recognizer means for receiving the reconstructed input signals and recognizing predetermined combinations of input signal logic level representations therein, and a state machine means for time-qualifying the combinations recognized by the word recognizer means.

11. The trigger circuit of claim 10 in which the word recognizer means comprises multiplexer means for selecting a logic level representation for each input signal line and combinational logic means for combining the selected logic level representations for detection of a triggering event comprised of a predetermined combination of logic level representations, the combinational logic means including the trigger event detection means for generating in response a detection signal if the input signals corresponding to the selected logic level representations are simultaneously present on all selected input lines.

12. The trigger circuit of claim 1 in which the trigger event detection means further includes trigger filter means for filtering out input signal representations of less than a predetermined duration.

13. The trigger circuit of claim 12 in which the trigger filter means includes means for adjusting the filter means to vary the duration of signals to be filtered.

14. The trigger circuit of claim 1 in which the logic level discrimination means comprises comparator means for receiving the input signals and comparing each input signal to the threshold levels and for generating encoded signals in response to the comparison, and logic means coupled to the comparator means for decoding the encoded signals into digital signals corresponding to each logic level representation.

15. The trigger circuit of claim 10 in which the state machine means includes means for measuring for a predetermined time in a predetermined sequence the duration of the combinations of input signal logic level representations recognized by the word recognizer means and transmitted to the state machine means, the state machine means generating in response to the recognized combinations a trigger display signal.

16. A method of generating a trigger display signal in response to combinations of detected input signals on plural input signal lines, comprising:
reconstructing each input signal into a high logic level representation thereof corresponding to a level of the input signal relative to a first threshold level, a low logic level representation thereof corresponding to a level of the input signal relative to a second threshold level which is below the first, and into a transitional logic level representation thereof corresponding to a level of the input signal relative to a transition level between the first and second threshold levels;
detecting in the reconstructed input signals a triggering event comprising at least one predetermined combination of input signal logic level representations; and
generating a trigger display signal in response to the detected triggering event.

17. The method of claim 16 in which detecting a triggering event includes the following sequential steps:
detecting as an arming event a first predetermined combination of input signal logic level representations; and
detecting as the triggering event in an immediately following combination of input signal logic level representations one of two second predetermined combinations of such representations.

18. The method of claim 16 in which detecting a triggering event includes the following sequential steps:
detecting as an arming event a first predetermined combination of input signal logic level representations;
detecting an absence of the arming event for a predetermined time thereafter; and
detecting as the triggering event within an immediately following predetermined time thereafter one of two second predetermined combinations of the input signal logic level representations.

19. The method of claim 16 in which detecting a triggering event includes the following sequential steps:
detecting as an arming event a first predetermined combination of input signal logic level representations; and
detecting as the triggering event in an immediately following combination of input signal logic level representations the absence of two second predetermined combinations.

20. The method of claim 16 in which detecting a triggering event includes the following sequential steps:
detecting as an arming event a first predetermined combination of input signal logic level representations;
detecting an absence of the arming event for a predetermined time thereafter; and
detecting as the triggering event within an immediately following predetermined time thereafter the absence of two predetermined combinations of input signal logic level representations.

21. The method of claim 16 in which detecting a triggering event includes detecting the transition logic level representation of at least one input signal occurring within a predetermined time before detecting the transition logic level representation of a second input signal, the second input signal representing a clock pulse.

22. The method of claim 16 in which detecting a triggering event includes detecting the transition logic level representation of at least one input signal occurring within a predetermined time after detection the transition logic level representation of a second input signal, the second input signal representing a clock pulse.

23. The method of claim 16 in which detecting a triggering event includes detecting an input signal that moves from and returns to a predetermined input signal logic level representation within a predetermined time.

24. The method of claim 16 in which detecting a triggering event includes detecting a transition logic level representation of one input signal enduring longer than a predetermined time.

* * * * *